United States Patent
Lou et al.

(10) Patent No.: US 11,362,146 B2
(45) Date of Patent: Jun. 14, 2022

(54) DISPLAY PANEL, DISPLAY SCREEN, AND DISPLAY TERMINAL WITH PLURALITY OF FILM LAYER AND MULTIPLE OPTICAL LENGTHS

(71) Applicant: Yungu (Gu'an) Technology Co., Ltd., Langfang (CN)

(72) Inventors: Junhui Lou, Langfang (CN); Lixiong Xu, Langfang (CN); Xiaoyang Tong, Langfang (CN)

(73) Assignee: YUNGU (GU'AN) TECHNOLOGY CO., LTD., Langfang (CN)

(*) Notice: Subject to any disclaimer, the term of this patent is extended or adjusted under 35 U.S.C. 154(b) by 178 days.

(21) Appl. No.: 16/896,221

(22) Filed: Jun. 9, 2020

(65) Prior Publication Data

US 2020/0303472 A1 Sep. 24, 2020

Related U.S. Application Data

(63) Continuation of application No. PCT/CN2019/073884, filed on Jan. 30, 2019.

(30) Foreign Application Priority Data

Sep. 14, 2018 (CN) .......................... 201811077014.8

(51) Int. Cl.
*H01L 27/32* (2006.01)
*H01L 51/52* (2006.01)

(52) U.S. Cl.
CPC ...... *H01L 27/3211* (2013.01); *H01L 27/3276* (2013.01); *H01L 27/3288* (2013.01); *H01L 51/5275* (2013.01)

(58) Field of Classification Search
CPC ............. H01L 27/3211; H01L 27/3276; H01L 27/3288; H01L 51/5275
See application file for complete search history.

(56) References Cited

U.S. PATENT DOCUMENTS 5,576,870 A  11/1996 Ohmae
6,639,250 B1  10/2003 Shimoda et al.
(Continued)

FOREIGN PATENT DOCUMENTS

CN  1367938 A  9/2002
CN  101606436 A  12/2009
(Continued)

OTHER PUBLICATIONS

International Search Report for Application No. PCT/CN2019/073884.
(Continued)

*Primary Examiner* — Lex H Malsawma
(74) *Attorney, Agent, or Firm* — Kilpatrick Townsend & Stockton

(57) ABSTRACT

The present application provides a display panel comprising a substrate and a plurality of film layers disposed on the substrate in sequence, and at least one of the film layers having a patterned structure, wherein the display panel has at least a first location and a second location different from the first location, and the film layers arranged in a thickness direction of the display panel at the first location are different from the film layers arranged in a thickness direction of the display panel at the second location, a first optical length $L_1$ at the first location and a second optical length $L_2$ at the second location meet the following conditions: $L_1 = d_1*n_1 + d_2*n_2 + \ldots + d_i*n_i$, $L_2 = D_1*N_1 + D_2*N_2 + \ldots + D_j*N_j$, $(m-\delta)\lambda \leq L_1 - L_2 \leq (m+\delta)\lambda$, wherein $\lambda$ is a constant between 380 nm and 780 nm; m is a natural number; and $\delta$ is a constant between 0 and 0.2.

19 Claims, 9 Drawing Sheets

(56) References Cited

U.S. PATENT DOCUMENTS

| | | | |
|---|---|---|---|
| 6,791,261 B1 | 9/2004 | Shimoda et al. | |
| 2003/0228740 A1* | 12/2003 | Nagai | H01L 21/0273 257/E29.151 |
| 2004/0245531 A1* | 12/2004 | Fuii | H01L 51/5237 257/88 |
| 2005/0225232 A1* | 10/2005 | Boroson | H01L 27/3206 313/504 |
| 2006/0214573 A1* | 9/2006 | Maeda | H01L 51/5271 313/506 |
| 2010/0320446 A1* | 12/2010 | Kang | H05B 33/10 257/E33.001 |
| 2013/0188253 A1* | 7/2013 | Nakai | G02B 5/28 359/584 |
| 2013/0215371 A1* | 8/2013 | Nakahara | G02F 1/134309 349/141 |
| 2013/0258570 A1 | 10/2013 | Nashiki et al. | |
| 2014/0016050 A1 | 1/2014 | Huang et al. | |
| 2014/0061595 A1* | 3/2014 | Kim | H01L 51/56 438/23 |
| 2014/0063423 A1 | 3/2014 | Chen et al. | |
| 2014/0097412 A1 | 4/2014 | Kuo et al. | |
| 2015/0027626 A1 | 1/2015 | Hada et al. | |
| 2015/0194633 A1 | 7/2015 | Lee et al. | |
| 2019/0025644 A1 | 1/2019 | Tan et al. | |
| 2020/0243801 A1* | 7/2020 | Xu | H01L 51/5275 |

FOREIGN PATENT DOCUMENTS

| | | |
|---|---|---|
| CN | 104280807 A | 1/2015 |
| CN | 104488106 A | 4/2015 |
| CN | 106158911 A | 11/2016 |
| CN | 107092402 A | 8/2017 |
| CN | 107505767 A | 12/2017 |
| CN | 207380686 U | 5/2018 |
| EP | 1811570 A2 | 7/2007 |
| JP | 3163887 B2 | 5/2001 |
| JP | 2003508876 A | 3/2003 |
| JP | 2003528421 A | 9/2003 |
| JP | 2007248674 A | 9/2007 |
| JP | 2008111978 A | 5/2008 |
| JP | 2012002832 A | 1/2012 |
| TW | I499831 B | 9/2015 |
| TW | I541701 B | 7/2016 |
| TW | I545370 B | 8/2016 |
| TW | I599082 B | 9/2017 |
| TW | I605951 B | 11/2017 |
| TW | I625242 B | 6/2018 |
| WO | 2018076857 A1 | 5/2018 |

OTHER PUBLICATIONS

Written Opinion for Application No. PCT/CN2019/073884.
First Office Action of Taiwan Application No. 108103909.
Decision of Grant of Taiwan Application No. 108103909.
Search Report of European Application No. 19860678.2.
First Office Action of Chinese Application No. 2018110770148.
First Office Action of Japan Application No. 2020-562823 dated Jun. 29, 2021.

* cited by examiner

DISPLAY PANEL, DISPLAY SCREEN, AND DISPLAY TERMINAL WITH PLURALITY OF FILM LAYER AND MULTIPLE OPTICAL LENGTHS

CROSS-REFERENCE TO RELATED APPLICATIONS

The present application is a continuation of International Application No. PCT/CN2019/073884, filed on Jan. 30, 2019, which claims priority to Chinese Patent Application No. 201811077014.8, filed on Sep. 14, 2018. Both applications are incorporated by reference herein in their entireties for all purposes.

TECHNICAL FIELD

The present application relates to the field of display technologies, and particularly relates to a display panel, a display screen, and a display terminal.

BACKGROUND

With rapid development of display terminals, users have an increasingly high level of demands for the screen ratio, such that the full screen display of display terminals has received more and more attention in the industry. Full screens are often routinely slotted or perforated to accommodate elements such as cameras and sensors, for example, bangs screens of Apple iPhones are usually slotted or perforated in a display area corresponding to elements such as cameras and sensors. When the camera is used for photographing, external light goes into the camera below the display screen through the slot or hole in the display screen, so as to realize photographing. However, neither the bangs screen nor the perforated screen is a true full display screen. Therefore, the industry is in urgent need of developing a true full display screen.

SUMMARY

Thus, aimed at solving the above technical problem, the present application provides a display panel for a full display screen, a display screen, and a display terminal.

For this, the present application provides the following technical solutions:

The embodiments of the present application provide a display panel, comprising a substrate, and a plurality of film layers disposed on the substrate in sequence, and at least one of the film layers having a patterned structure, wherein the display panel has at least a first location and a second location different from the first location, and the film layers arranged in a thickness direction of the display panel at the first location are different from the film layers arranged in a thickness direction of the display panel at the second location, the film layers arranged in the thickness direction of the display panel at the first location has a total number of i and respective thicknesses of $d_1, d_2, \ldots d_i$; the film layers disposed arranged in the thickness direction of the display panel at the second location has a total number of j and respective thicknesses of $D_1, D_2, \ldots D_j$; i and j are natural numbers, wherein a first optical length $L_1$ at the first location and a second optical length $L_2$ at the second location meet the following conditions:

$$L_1 = d_1 * n_1 + d_2 * n_2 + \ldots + d_i * n_i,$$

$$L_2 = D_1 * N_1 + D_2 + \ldots + D_j * N_j$$

$$(m-\delta)\lambda \leq L_1 - L_2 \leq (m+\delta)\lambda, ,$$

wherein, $n_1, n_2, \ldots, n_i$ are film layer coefficients corresponding to the respective film layers arranged in the thickness direction of the display panel at the first location; $N_1, N_2, \ldots, N_j$ are film layer coefficients corresponding to the respective film layers arranged in the thickness direction of the display panel at the second location; $n_1, n_2, \ldots, n_i$ and $N_1, N_2, \ldots, N_j$ are constants between 1 and 2; $\lambda$ is a constant between 380 nm and 780 nm; m is a natural number; and $\delta$ is a constant between 0 and 0.2.

Optionally, $\lambda$ represents a wavelength of visible light, $n_1, n_2, \ldots, n_i$ and $N_1, N_2, \ldots, N_j$ represent refractive indices of the corresponding film layers at the wavelength of visible light.

Optionally, $L_1 - L_2$ has a value of 0.

Optionally, the display panel is an active matrix organic light emitting diode (AMOLED) display panel or a passive matrix organic light emitting diode (PMOLED) display panel, and the film layers include an encapsulation layer, a second electrode layer, a light emitting layer, a first electrode layer, and a pixel defining layer; the film layers arranged in the thickness direction of the display panel at the first location form a first path, and the film layers arranged in the thickness direction of the display panel at the second location form a second path or a third path, wherein, the first path comprises the encapsulation layer, the second electrode layer, the light emitting layer, the first electrode layer, and the substrate; the second path comprises the encapsulation layer, the second electrode layer, the pixel defining layer, the first electrode layer, and the substrate; and the third path comprises the encapsulation layer, the second electrode layer, the pixel defining layer, and the substrate.

Optionally, the display panel is a film-encapsulated flexible screen, the encapsulation layer comprises a thin film encapsulation layer, the thin film encapsulation layer comprises an organic material encapsulation layer, and the thickness of the organic material encapsulation layer in the first path is greater than the thickness of the organic material encapsulation layer in other paths.

Optionally, the display panel is a hard screen encapsulated with glass powder, the encapsulation layer comprises a vacuum gap layer and an encapsulation substrate, and the thickness of the vacuum gap layer in the first path is greater than the thickness of the vacuum gap layer in other paths.

Optionally, $\lambda$ has a value range of 500 nm-600 nm, preferably 550 nm.

Optionally, the display panel is an active matrix organic light emitting diode (AMOLED) display panel, and the film layers further comprise a conductive line, the conductive line is a single-layer line or a multilayer line, and the conductive line includes at least one of a scanning line, a data line, a power line, and a reset line; the film layers arranged in the thickness direction of the display panel at the first location or the second location also form a fourth path comprising the encapsulation layer, the second electrode layer, the pixel defining layer, the conductive line and the substrate.

Optionally, the conductive line is a single-layer line, the conductive line is disposed in the same layer as the first electrode layer, and the conductive line and the first electrode layer are made of the same material, and the fourth path and the second path comprise the same film layers with the same thicknesses; or the conductive line is a multilayer line, and at least one layer of the multilayer line is disposed in the same layer as the first electrode layer, and the conductive line and the first electrode layer are made of the same material or different materials.

Optionally, the conductive line is a double-layer line comprising a first conductive line and a second conductive line, the first conductive line is disposed in the same layer as the first electrode layer, and the film layers further include a planarization layer, and the second conductive line is disposed between the planarization layer and the substrate, and the first conductive line and the second conductive line are made of the same material as the first electrode layer, and the fourth path comprises the encapsulation layer, the second electrode layer, the pixel defining layer, the first conductive line and/or the second conductive line, and the substrate.

Optionally, when a projection of the conductive line on the substrate partially overlaps a projection of the first electrode layer on the substrate, a fifth path comprising the encapsulation layer, the second electrode layer, the light emitting layer, the first electrode layer, the second conductive line and the substrate is further provided.

Optionally, the display panel is an active matrix organic light emitting diode (AMOLED) display panel, and the film layers further comprise a support layer disposed on the pixel defining layer and a thin film transistor (TFT) structure layer for making a pixel circuit, and the support layer is a transparent structure, and at least one of the second path, the third path and the fourth path further comprises the support layer and/or the thin film transistor structure layer.

Optionally, the display panel is an active matrix organic light emitting diode (AMOLED) display panel, and the film layers further comprise a support layer disposed on the pixel defining layer and a thin film transistor structure layer for making a pixel circuit, and the support layer is an opaque structure, and the thin film transistor structure layer is disposed beneath the support layer.

Optionally, the display panel is an AMOLED display panel, and the first electrode has a circular shape, an oval shape or a dumbbell shape.

Optionally, pixel openings are formed in the pixel defining layer, the pixel openings comprise a first type of pixel openings; and each side of a projection of each of the first type of pixel openings on the substrate has a curved shape and is not parallel to each other.

Optionally, a projection of each of the first type of pixel openings on the substrate is an image unit or a plurality of image units interconnected with each other; the image unit(s) has/have a circular or oval shape.

Optionally, the conductive line is curvilinear in an extending direction thereof; the conductive line is provided around the first electrode, and the conductive line extends in a curve around an edge of the first electrode.

Optionally, both sides of the conductive line in an extending direction thereof have a wave shape, wave crests of the two sides are oppositely disposed, and wave troughs of the two sides are oppositely disposed.

Optionally, the display panel is a passive matrix organic light emitting diode (PMOLED) display panel, and the film layers further comprise an isolation pillar disposed on the pixel defining layer, and the a sixth path comprising the second electrode layer, the isolation pillar, the pixel defining layer and the substrate is also provided, and the isolation pillar is made of transparent material.

Optionally, the isolation pillar comprises a plurality of first type isolation pillars; and the width of the first type isolation pillar changes continuously or intermittently in an extending direction thereof parallel to the substrate; and the width refers to a dimension of a projection of the first type isolation pillar on the substrate in a direction perpendicular to the extending direction.

Optionally, the display panel is a passive matrix organic light emitting diode (PMOLED) display panel, and both sides of the first electrode or the second electrode in an extending direction thereof have a wave shape, wave crests of the two sides are oppositely disposed, and wave troughs of the two sides are oppositely disposed; preferably, wave crests and wave troughs of adjacent first electrodes or adjacent second electrodes are staggered with one another.

Optionally, the film layers further comprise a conductive line, and the conductive line is a single-layer line or a multilayer line, and the conductive line comprises at least one of a scanning line, a data line, a power line, and a reset line.

Optionally, when the conductive line is a single-layer line, the conductive line is disposed in the same layer as the first electrode layer; or when the conductive line is a multilayer line, at least one layer of the conductive line is disposed in the same layer as the first electrode layer, and the conductive line and the first electrode layer are made of the same material or different materials.

Optionally, when a projection of the conductive line on the substrate partially overlaps a projection of the first electrode layer on the substrate, the film layers arranged in the thickness direction of the display panel at the first location or the second location also form a seventh path comprising the encapsulation layer, the second electrode layer, the light emitting layer, the first electrode layer, the conductive line and the substrate.

Optionally, for the first location and the second location, the thickness and/or the refractive indices of one or more film layers having differences at the first position and the second position can be adjusted, so that the first position and the second position can meet the above conditions.

The embodiments of the present application further provide a display screen, comprising at least one display area, the at least one display area comprising a first display area, and a photosensitive device being disposed below the first display area; wherein the display panel according to any embodiment of the present application is disposed in the first display area, and every display area of the at least one display area is used to display a dynamic or static image.

Optionally, the at least one display area further comprises a second display area; the display panel provided in the first display area is a passive matrix organic light emitting diode (PMOLED) display panel or an active matrix organic light emitting diode (AMOLED) display panel, and the display panel provided in the second display area is an active matrix organic light emitting diode (AMOLED) display panel.

The embodiments of the present application also provide a display terminal, comprising an apparatus body, having a device area; and the display screen according to any of the above embodiments, covering the apparatus body; wherein the device area is located below the first display area and provided with a photosensitive device for collecting light through the first display area.

Optionally, the device area is a slotted area, and the photosensitive device comprises a camera and/or a light sensor.

The technical solutions of this application have the following advantages:

(1) In the display panel provided in the embodiments of the present application, the film layers have a patterned structure, and the display panel has at least a first location and a second location different from the first location, and the first location and the second location meet the following condition: $(m-0.2)\lambda < L_1 - L_2 < (m+0.2)\lambda$. Since the first location and the second location meet the above condition, when light exits the display panel after going through a first path and a second path, the phase difference of the light beams is relatively small. Since a phase difference generated between light beams with the same initial phase position after passing through the display panel is one of the important reasons for occurrence of diffraction, in the technical solution of the present application, after the light beams with the same initial phase position pass through the display panel via the first path and the second path, the phase difference thereof is within a preset range such that the diffraction phenomenon caused by phase difference is alleviated, so that image distortion due to the above-mentioned diffraction is relatively less after light passes through the display panel, which improves the clarity of the image captured by a camera behind the display panel, and enables a photosensitive device behind the display panel to acquire clear and real images, thereby realizing full-screen display.

(2) In the display panel provided in the embodiments of the present application, the first location and the second location correspond to locations where incident light enters each path. There are multiple paths for light beams to pass through the display panel, and the number of paths is determined according to the types of paths of the display panel to be passed through by light beams that are vertical to the display panel, and different paths comprise different film layers. When there are multiple paths, the difference value between the optical lengths formed by incident light passing through two of the multiple paths deviates from an integer multiple of the wavelength of the incident light by a deviation value which is in a preset range, such that diffraction caused by light beams passing through the display panel via these paths can be effectively alleviated. When there are more paths meeting such condition, the diffraction phenomenon caused by light beams passing through the display panel would be weaker. As a preferred solution, the difference value between the optical lengths formed by light beams passing through any two of the multiple paths deviates from an integer multiple of the wavelength of the incident light by a deviation value within the preset range. In this way, the phase difference caused by phase diversity after light passes through the display panel can be eliminated, therefore, the diffraction phenomena can be greatly alleviated.

(3) The display panel in the embodiments of the present application can be a passive matrix organic light emitting diode (PMOLED) or an active matrix organic light emitting diode (AMOLED). There are different paths when light passes through the display panel according to different film layer structures of the display panel. By adjusting the thickness and/or refractive index of one of the film layers in a specific path, the difference value between an optical length of light passing through this specific path and the optical length(s) of another path or other paths can be made to meet the above condition, wherein the thickness of the film layer can be adjusted according to practical needs, and if the thickness can't be adjusted under the condition of meeting performance requirements, the material of the film layer can be adjusted instead, thereby changing the refractive index of the film layer, which can also achieve the above purpose.

(4) In the display panel in the embodiments of the present application, the thickness of the pixel defining layer or the thickness of the electrode layer(s) can be preferentially adjusted, and because the thickness of the pixel defining layer is larger than that of other film layers and the thickness thereof is easy to be adjusted, the optical length of a path to be passed through by light can be adjusted preferentially by adjusting the thickness of the pixel defining layer under the condition of meeting performance requirements. In addition, the material of the pixel defining layer can also be adjusted to change the refractive index of the pixel defining layer, and the optical length of a path to be passed through by light can be adjusted by adjusting the refractive index of the pixel defining layer, so that the diffraction phenomenon caused by light passing through the display panel can be alleviated.

(5) The embodiments of the present application further provide a display screen, and a display terminal having the display screen, equipped with the display panel of any of the above embodiments, wherein a photosensitive device such as a camera or a light sensor is disposed below the display panel, and because the display panel can better alleviate diffraction, the camera and the light sensor can capture more real incident light.

BRIEF DESCRIPTION OF THE DRAWINGS

In order to more clearly illustrate the specific embodiments of the present application or the technical solutions in prior art, the drawings used for describing the specific embodiments or the prior art will be briefly introduced below. Apparently, the appended drawings referred to in the following description only represent some embodiments of the present application, and a person skilled in the art can obtain other drawings based on these drawings without expenditure of creative labor.

DETAILED DESCRIPTION

Figure 1:
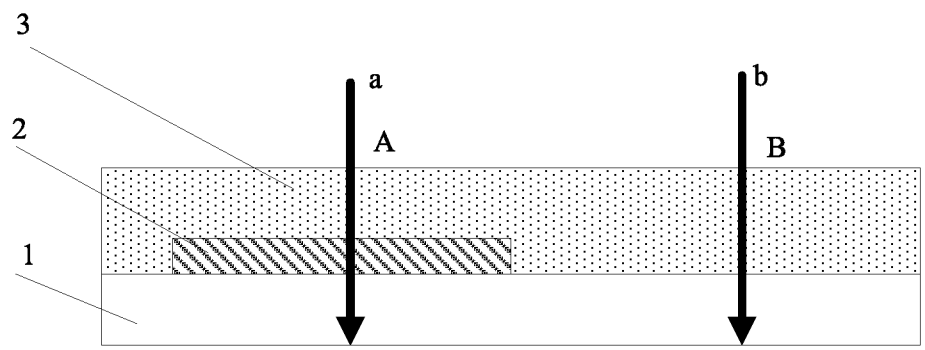
FIG. 1 is a structural view showing a display panel in an embodiment of the present application.

In the description of the present application, it should be understood that the terms "center", "transverse", "upper", "lower", "left", "right", "vertical", "horizontal", "top", "bottom", "inside" and "outside" indicate orientation or positional relationship which are based on the orientation or positional relationship shown in the drawings, and it is merely for convenience of describing the present application and simplifying the description, rather than indicating or implying that the indicated device or element must have a particular orientation or must be constructed and operated in a particular orientation. Therefore, these terms should not be understood as limiting the scope of the present application. In addition, it should be noted that, when an element is referred to as "formed on another element", the element can be directly connected to the another element or an intermediate element may be present at the same time. When an element is considered as being "connected" to another element, it can be directly connected to the another element, or an intermediate element may be present at the same time. In contrast, when an element is referred to as being "directly on" another element, there is no intermediate element.

As described in the background part, the so-called full display screen in prior art is not a true full display screen. However, during the research, it was found that if the display panel directly covers on a photosensitive device such as a camera, the display panel located above the photosensitive device such as the camera is required to have a high light transmittance. However, it was further discovered by the inventors that, when a photosensitive device such as a camera is disposed below a transparent display panel, the photographed photos are blurred. Further, the inventors found out that the reason for this problem is that there are patterned film layer structures in the display screen, and when external light pass through these patterned film layer structures, diffraction of light will occur, resulting in blurred photos.

Furthermore, the inventors also found out that, different sectional structures are formed in the area comprising the patterned film layers and the area without the patterned film layers, so when light enters the display screen and reaches the photosensitive device, the optical paths passed through by the light beams are different. When light passes through different areas of the transparent screen, there is a difference value between the optical lengths of light beams due to differences in the refractive indices and thicknesses of the different film layer structures. When light passes through these different areas, the light beams having the same initial phase position originally will generate a phase difference. The phase difference is one of the important reasons for occurrence of diffraction, and the phase difference will cause significant diffraction phenomena, which will cause diffraction fringes after light passes through the display panel, making the picture distorted and blurred.

In addition, due to the pixel openings, electrodes, conductive line wiring, etc. in the display screen of electronic devices, external light will have relatively complicated diffraction intensity distribution when passing through edges of these areas, thereby resulting in diffraction fringes, which in turn adversely affects normal working of the photosensitive device such as a camera. For example, when the camera located below the transparent display area works, notable diffraction occurs when external light passes through the conductive line wiring, electrode edges or pixel opening edges in the display screen, such that the picture taken by the camera is distorted.

The present embodiment provides a display panel, as shown in FIG. 1, the display panel comprises a substrate 1, and a first film layer 2 and a second film layer 3 disposed on the substrate 1 in sequence. The first film layer 2 has a patterned structure, and the second film layer 3 is a film layer disposed on the first film layer 2. Since the second film layer has a patterned structure, the display panel are provided with a first location A and a second location B different from the first location, the film layers arranged in a thickness direction of the display panel at the first location A are different from the film layers arranged in a thickness direction of the display panel at the second location B, as shown in a path a and a path b in FIG. 1. In the present embodiment, the path a and the path b respectively comprise different film layers. The path a comprises the second film layer 3, the first film layer 2, and the substrate 1. The path b comprises the second film layer 3 and the substrate 1. The path a and the path b meet the following conditions: the substrate 1, the first film layer 2 and the second film layer 3 respectively have film layer coefficients of $n_1$, $n_2$ and $n_3$, and the substrate 1 has a thickness of $d_1$, the first film layer has a thickness of $d_2$, and the second film layer has a thickness of $d_a$ in the path a, and the second film layer has a thickness of $d_b$ in the path b. In this embodiment, $d_2 + d_a = d_b$, and $L_a = n_1 \times d_1 + n_2 \times d_2 + n_3 \times d_a$; $L_b = n_1 \times d_1 + n_3 \times d_b$. $L = L_a - L_b$ and L meets meet the following condition: $(m-0.2)\lambda < L < (m+0.2)\lambda$, wherein, m is a natural number; $\lambda$ represents a distance coefficient and has a value between 380 nm to 780 nm.

In this embodiment, the film layer coefficients $n_1$, $n_2$ and $n_3$ respectively correspond to the substrate 1, the first film layer 2 and the second film layer 3, and $\lambda$ is a wavelength of visible light.

The display panel in this solution has a patterned structure in the film layer thereof; the film layers arranged in a thickness direction of the display panel at the first location A are different from the film layers arranged in a thickness direction of the display panel at the second location B, and the first location A and the second location B correspond to two locations where light passes vertically through the display panel, forming two paths to be passed through by light. By reasonably setting the thicknesses of the first film layer and the second film layer and reasonably selecting the film layer coefficients of the first film and the second film layer such that the locations A and B meet the above condition, that is, when light enters the display panel perpendicular to the substrate surface via the path a and the path b, a difference value between the optical lengths of the two paths and the wavelength of light meet the above conditions, and as a result, when light exits the display panel via the path a and the path b, the phase difference thereof is relatively small. Since a phase difference generated between light beams with the same initial phase position after passing through the display panel is one of the important reasons for occurrence of diffraction, when using the technical solution of the present embodiment, the phase difference of the light beams is relatively small and diffraction is weak after light beams with the same initial phase position pass through the display panel via the two different paths, and diffraction phenomenon caused by phase difference is alleviated, so that the above-mentioned image distortion due to diffraction does not occur after light passes through the display panel, which improves the clarity of the image captured by the camera behind the display panel, and enables the photosensitive device behind the display panel to acquire clear and real images, thereby realizing full-screen display.

In some specific embodiments, the difference value of $L_a-L_b$ is selected as 0, in other words, the difference value between the optical lengths of the two paths is 0 which is easier to be implemented and operated as compared to an integer multiple of the wavelength of light.

In other alternative embodiments, the number of film layers arranged at the first location and the second location can be determined according to actual needs. For example, the film layers arranged in the thickness direction of the display panel at the first location has a total number of i and respective thicknesses of $d_1, d_2, \ldots d_i$; the film layers arranged in the thickness direction of the display panel at the second location has a total number of j and respective thicknesses of $D_1, D_2, \ldots D_j$; i and j are natural numbers, wherein a first optical length $L_1$ at the first location and a second optical length $L_2$ at the second location meet the following conditions:

$$L_1 = d_1*n_1 + d_2*n_2 + \ldots + d_i*n_i,$$

$$L_2 = D_1*N_1 + D_2*N_2 + \ldots + D_j*N_j,$$

$$(m-0.2)\lambda \leq L_1 - L_2 \leq (m+0.2)\lambda,$$

wherein, $n_1, n_2, \ldots, n_i$ are film layer coefficients corresponding to the respective film layers arranged in the thickness direction of the display panel at the first location; $N_1, N_2, \ldots, N_j$ are film layer coefficients corresponding to the respective film layers arranged in the thickness direction of the display panel at the second location; $n_1, n_2, \ldots, n_i$ and $N_1, N_2, \ldots, N_j$ are constants between 1 and 2; $\lambda$ is a constant between 380 nm and 780 nm; m is a natural number. The $n_1, n_2, \ldots, n_i$ and $N_1, N_2, \ldots, N_j$ have values between 1 and 2, corresponding to the value ranges of respective refractive indices of the film layers in the transparent screen, and the distance coefficient $\lambda$ corresponds to a wavelength of visible light. The light passing through at the first location has an optical path $L_1$ and the light passing through at the second location has an optical path $L_2$, that is, the difference value between the optical lengths of light passing through at the first location and at the second location is $L_1-L_2$. In the above conditions, a difference value between the optical lengths deviates from an integer multiple of the wavelength by a deviation value within a preset range. After light passes through the panel at the first location and the second location, the phase difference thereof is small, and the diffraction phenomenon incurred is not notable.

The first location and the second location may also be any locations where light is incident, as long as the film layers arranged in a thickness direction of the display panel at the first location are different from the film layers arranged in a thickness direction of the display panel at the second location. In other embodiments, the concerned film layer may be multiple film layers, wherein one or more of the film layers have a patterned structure, so that when light passes through the display panel vertically, a plurality of paths are formed. Each of the paths comprises different film layers. The difference value between the optical lengths of at least two of the paths to be passed through by light in association with the wavelength of the light meet the above conditions, so that the diffraction phenomenon of light after passing through the at least two paths can be alleviated. The diffraction phenomenon of light after passing through the display panel via these paths can be effectively alleviated. When there are more paths meeting such condition, the diffraction phenomenon caused by light beams passing through the display panel would be weaker. As a further preferred solution, when externally incident light enters the display panel in a direction orthogonal to the surface of the substrate and passes through any two of the several paths, the difference value of the optical lengths obtained meets the above correspondence relationship. In this way, the phase difference caused by phase diversity after light passes through the display panel can be eliminated, such that the occurrence of diffraction phenomena can be greatly alleviated.

Figure 2:
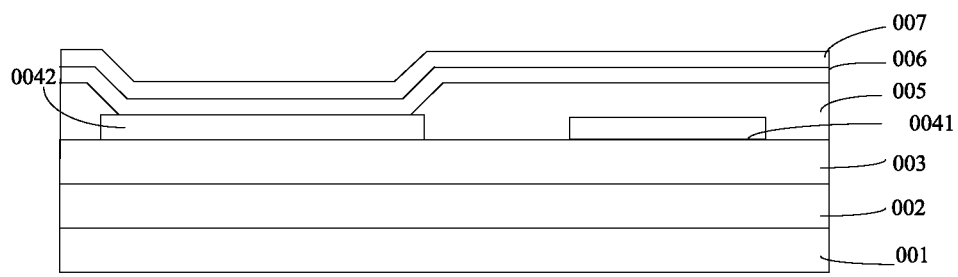
FIG. 2 is a structural view showing a display panel in another embodiment of the present application.

As a specific embodiment, the display panel in this embodiment is an AMOLED display panel. As shown in FIG. 2, the display panel comprises a substrate 001, a laminate layer 002, a planarization layer 003, a conductive line 0041, an anode layer 0042, a pixel defining layer 005, a light emitting structure layer 006, and a cathode layer 007.

The substrate 001 here can be a rigid substrate, e.g. a transparent substrate such as a glass substrate, a quartz substrate or a plastic substrate; the substrate 001 can also be a flexible transparent substrate, such as a polyimide (PI) film, so as to improve the transparency of the device. Since the substrate is the same in all paths through which the light passes vertically, the substrate has no substantial influence on the difference between the optical lengths of different paths to be passed through by light.

A laminate layer 002 is disposed on the substrate 001, and the laminate layer 002 includes pixel circuits. Specifically, it comprises one or more switching devices and capacitors and other devices. A plurality of switching devices are connected in series or in parallel, according to needs, to form a pixel circuit such as 2T1C (2 transistors plus 1 capacitor) and 7T1C (7 transistors plus 1 capacitor), which is not limited herein. The switching device can be a thin film transistor (TFT), the thin film transistor can be an oxide thin film transistor or a low temperature polycrystalline silicon thin film transistor (LTPS TFT), and the thin film transistor is preferably an indium gallium zinc oxide thin film transistor (IGZO TFT). In another alternative embodiment, the switching device can also be a metal-oxide semiconductor field effect transistor (MOSFET), and can also be other components with conventional switching characteristics, such as an insulated gate bipolar transistor (IGBT), etc., as long as the components can implement the switching function in the present embodiment and can be integrated into the display panel, they all fall into the protection scope of the present application.

A pixel driving circuit comprises a variety of devices, thus forming a multilayer film structure which comprises a source electrode, a drain electrode, a gate electrode, a gate insulating layer, an active layer, an interlayer insulating layer, etc. Each film layer is formed with a patterned film layer structure. In different paths, light passes through different pathways, so the optical length of the path through which light passes can be adjusted by adjusting the thickness or refractive index of each film layer in the pixel circuit. In addition to adjusting the film layers of each path within the laminate layer 002, other film layers can also be adjusted to work together for adjusting the optical length of the path to be passed through by light.

A planarization layer 003 is disposed on the laminate layer 002, and a flat plane is formed by the planarization layer 003, which is convenient for setting electrodes and conductive lines, etc. thereon. Since the laminate layer 002 has a patterned structure, the thickness of the planarization layer 003 is different at different locations. By adjusting the thicknesses and refractive indices at different locations of the planarization layer, the optical lengths of different paths can be adjusted.

An anode layer 0042 and a conductive line 0041 are disposed on the planarization layer 003. The anode layer 0042 and the conductive line 0041 in FIG. 2 are disposed in the same layer. In other embodiments, the anode layer 0042 and the conductive line 0041 can be disposed in different layers that are manufactured separately. The conductive lines comprise at least one of scan lines, data lines, power lines, and reset lines. The scan lines may comprise a SCAN line and an EM line, and the data line is $V_{data}$, the power line is VDD or VSS, and the reset line is $V_{ref}$.

The conductive line may be a single layer or multiple layers of conductive lines disposed on the planarization layer, or the conductive line may be multiple layers of conductive lines spaced apart and having patterns crossing each other. The anode layer 0042 and the conductive line 0041 may be made of transparent conductive materials. Indium tin oxide (ITO), indium zinc oxide (IZO), or silver-doped oxide, Indium tin oxide (Ag+ITO), or silver-doped indium zinc oxide (Ag+IZO) may be generally used. Preferably, the conductive material is indium zinc oxide, as the manufacturing process of ITO is mature and the cost thereof is low. Furthermore, in order to reduce the resistance of each conductive line while ensuring high light transmittance, materials such as aluminum-doped zinc oxide, silver-doped ITO, or silver-doped IZO are used as the transparent conductive materials.

Both the thickness and the refractive index of the anode layer 0042 and the conductive line 0041 can be adjusted. By adjusting the thickness or adjusting the refractive index or adjusting both the thickness and the refractive index at the same time, the optical length of the path to be passed through by light can be adjusted, so that the difference value between the optical length of a specific path and the optical length of another path meets the above conditions. When the anode layer 0042 is made of ITO, the thickness thereof 0042 is generally in the range of 20 nm to 200 nm, and the thickness of the ITO layer can be adjusted within this range. When the conductive lines 0041 and the anode layer 0042 are prepared separately, their thicknesses and refractive indices can be adjusted separately. If the conductive lines have a multilayer structure, the thickness and/or refractive index of each layer of conductive line can also be adjusted separately. If they are formed in the same layer, the thickness and refractive index of both the conductive line 0041 and the anode layer 0041 can only be adjusted at the same time.

In the present embodiment, the conductive line 0041 and the anode layer 042 are disposed in the same layer. In other embodiments, when the conductive lines 0041 are multiple layers of lines, there may be one layer of conductive line disposed in the same layer as the anode layer, and the line and the anode layer can be made of the same material or different materials.

In other embodiments, the conductive line may also be a double-layer line, for example, the conductive line comprises a first conductive line and a second conductive line. The first conductive line is disposed in the same layer as the anode layer, and the second conductive line is disposed between a planarization layer and a substrate. The first conductive line and the second conductive line are made of the same material as the first electrode layer (anode layer). An encapsulation layer, a second electrode layer (cathode layer), a pixel defining layer, the first conductive line and a substrate form a light path; an encapsulation layer, a second electrode layer, a pixel-defining layer, the second conductive line and a substrate may also form another light path; in a portion where projections of the first conductive line and the second conductive line overlap, an encapsulation layer, the second electrode layer (cathode layer), the pixel-defining layer, the first conductive line, the second conductive line and the substrate may also form still another light path.

In a specific embodiment, when a projection of the conductive line on the substrate overlaps with a projection of the first electrode layer (anode layer) on the substrate, the paths through which light passes through may further include a path comprising an encapsulation layer, a second electrode layer (cathode layer), a light emitting layer, a first electrode layer (anode layer), a second conductive line, and a substrate.

A pixel defining layer 005 is disposed on the anode layer 0042 to limit the position of the pixels, and pixel openings are formed in the pixel defining layer 005. The pixel defining layer 005 has a relatively large thickness to allow for a large adjustable range. The pixel defining layer 005 generally has a thickness of 0.3-3 μm, and the thickness of the pixel defining layer 005 can be adjusted within this range. Therefore, it is preferable to adjust the thickness of the pixel defining layer 005 so that the optical length meets the above conditions. If adjusting the thickness of the pixel defining layer 005 alone cannot meet the requirements, the material of the pixel defining layer 005 can be adjusted together, thus adjusting its refractive index; or both the thickness and refractive index of the pixel defining layer 005 may be adjusted at the same time, so as to adjust the optical length of the path to be passed through by light.

Figure 3:
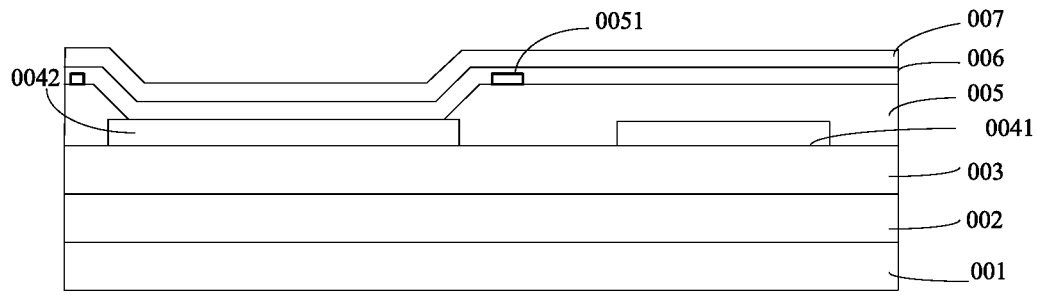
FIG. 3 is a structural view showing a display panel in another embodiment of the present application, in which a support layer 0051 is disposed upon the pixel defining layer 005 for supporting a mask during a production process with respect to the embodiment of FIG. 2.
Figure 4:
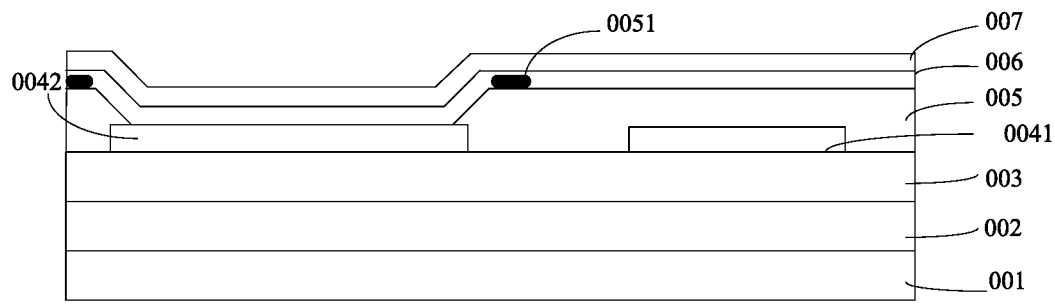
FIG. 4 is a structural view showing a display panel in another embodiment of the present application, in which the support layer 0051 is provided as an opaque structure.

In some embodiments, a support layer 0051 is disposed upon the pixel defining layer 005 for supporting a mask during a production process. As shown in FIG. 3, if the support layer 0051 is a transparent structure, for the optical path passing through the support layer 0051, the optical length of the path can also be adjusted by adjusting the thickness and refractive index of the support layer 0051. Since the pixel driving circuit structure in the laminate layer 002 is relatively more complicated and the adjustment of each film layer therein is also relatively more complicated, the support layer 0051 can also be provided as an opaque structure, as shown in FIG. 4, if a black opaque structure is used (a black opaque support layer, referred to as a spacer or a SPC), and one or more TFT structures in the pixel circuit set beneath the black support layer 0051 can be shielded by the black opaque structure, so that light does not pass through the plurality of film layer structures in the pixel circuit when it passes through the display panel, therefore, the process of adjusting the optical lengths of different paths is simplified while preventing diffraction phenomenon from being caused by the patterned structure of this part of film layers.

Pixel openings are formed in the pixel defining layer 005, and a light emitting structure layer 006 is disposed in each of the pixel openings and upon the pixel defining layer 005. An organic light-emitting diode (OLED) is used herein, and the light emitting structure layer 006 generally comprises a light extraction layer, an electron injection layer, an electron transport layer, a hole blocking layer, a light emitting layer, a hole transport layer, and a hole injection layer. All the layers are arranged on the entire surface except for the light-emitting layer, so that all the layers other than the light-emitting layer have no influence on the difference value between optical lengths of the paths to be passed though by light. The light-emitting layer is disposed in each of the pixel openings. Different light-emitting sub-pixels comprise different light-emitting materials, including red light-emitting materials, blue light-emitting materials, and green light-emitting materials. As to different light-emitting sub-pixels, the optical length of the paths to be passed through by light can also be adjusted by adjusting the thickness or refractive index of the light-emitting materials in the light-emitting layer, or adjusting both the thickness and refractive index of the light-emitting materials at the same time.

Because the overall thickness of the light emitting structure layer is small, the adjustable range thereof is small, and generally, the optical length can be adjusted in cooperation with other film layers, and it is difficult to adjust this layer alone to make the optical length meet the above conditions.

Figure 5:
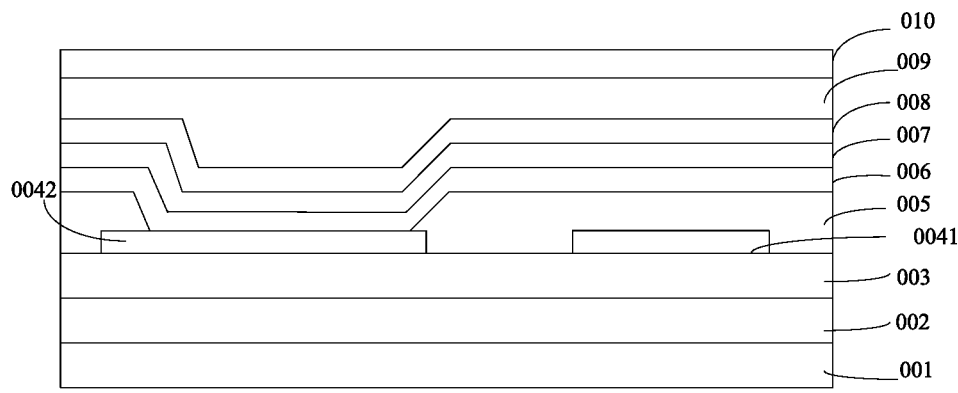
FIG. 5 is a structural view showing a display panel in another embodiment of the present application, in which a cathode layer 007 is disposed on the light emitting structure layer 006 and a light extraction layer 008 can be further disposed on the cathode layer 007.

A cathode layer 007 is disposed on the light emitting structure layer 006. Since the cathode layer is arranged on the entire surface, the cathode layer has no substantial influence on the difference value between the optical lengths of the paths to be passed through by light. A light extraction layer 008 can be further disposed on the cathode layer 007, as shown in FIG. 5. The light extraction layer 008 can be omitted in some embodiments.

An encapsulation layer is disposed on an outer side of the light extraction layer 008. The encapsulation layer can be encapsulated with a hard screen encapsulation or an organic thin film encapsulation. The display panel in FIG. 5 is a hard screen encapsulated with glass powder (i.e., Frit encapsulation), wherein the encapsulation layer comprises a low vacuum gap layer 009 and an encapsulation substrate 010. The vacuum gap layer is filled with an inert gas, and the encapsulation substrate is an encapsulation glass.

In the display panel shown in FIG. 5, when lights pass through the display panel, a plurality of optical paths can be formed. Since the display panel has two types of light-emitting structures including a top-emitting structure and a bottom-emitting structure. If the display panel has a top-emitting structure, a side to be encapsulated faces outward, the substrate is on an inner side, and the camera is disposed below the substrate. If the display panel has a bottom-emitting structure, a side where the substrate is located faces outward and a side to be encapsulated faces inward, and the camera is disposed below the encapsulation glass. The display panel is a transparent display panel, and when a camera disposed below the display panel works, pixels in the camera area do not emit light, so as to allow external light to pass through.

Figure 6:
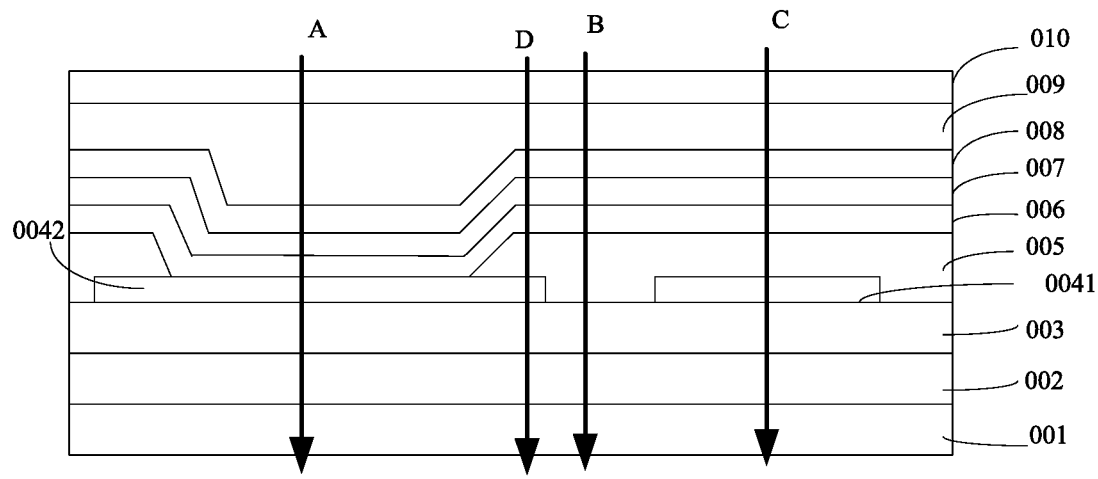
FIG. 6 is a structural view of light passing through a display panel in another embodiment of the present application.

Regardless whether the panel is a top-emitting structure or a bottom-emitting structure, the paths of light passing through the panel are the same. The top-emitting structure is taken as an example for illustration. Light enters the display screen from the side of the encapsulation glass 010, and as the light pass through the display panel, various paths are formed, as shown in FIG. 6.

A path A sequentially passes through an encapsulation substrate 010, a vacuum gap layer 009, a light extraction layer 008, a cathode layer 007, a light emitting structure layer 006, an anode layer 0042, a planarization layer 003, a laminate layer 002, and a substrate 001.

A path B sequentially passes through an encapsulation glass layer 010, a vacuum gap layer 009, a light extraction layer 008, a cathode layer 007, a light emitting structure layer 006, a pixel defining layer 005, a planarization layer 003, a laminate layer 002, and a substrate 001.

A path C sequentially passes through an encapsulation glass layer 010, a vacuum gap layer 009, a light extraction layer 008, a cathode layer 007, a light emitting structure layer 006, a pixel defining layer 005, a conductive line 0041, a planarization layer 003, a laminate layer 002, and a substrate 001.

A path D sequentially passes through an encapsulation glass layer 010, a vacuum gap layer 009, a light extraction layer 008, a cathode layer 007, a light emitting structure layer 006, a pixel defining layer 005, an anode layer 0042, a planarization layer 003, a laminate layer 002, and a substrate 001.

The thickness of the low vacuum gap layer in the path A is larger than the thickness of the low vacuum gap layer in the other paths.

The optical length of the path A to be passed through by light is $L_A$, the optical length of the path B to be passed through by light is $L_B$, and the optical length of the path C to be passed through by light is $L_C$. By adjusting the thickness or refractive index of one or more of the above-mentioned film layers, the following formula can be met:

$$(m-\delta)\lambda \leq L_A - L_B \leq (m+\delta)\lambda,$$

m is an integer, $\lambda$ represents a wavelength of light, and $\delta$ is a constant between 0 and 0.2, such as a suitable value selected from 0, 0.1, 0.15, or 0.2. The smaller $\delta$ is, the smaller the allowable phase difference between the optical lengths of two paths to be passed through by light.

Difference values between optical lengths of any two paths selected from the path A, the path B, and the path C meets the above formula.

When $\delta$ is selected as 0, the difference value between the optical lengths of the paths A, B, and C is an integer multiple of the wavelength of light. Thus, after light passes through the three paths of the path A, the path B and the path C respectively, the phase difference between the phase position of the incident light and the phase position of the exiting light is relative small, which can greatly alleviate the occurrence of diffraction phenomena.

The calculation formula of the above-mentioned optical lengths $L_A$, $L_B$, and $L_C$ are as follows: $L = d_1 * n_1 + d_2 * n_2 + \ldots + d_i * n_i$, where L represents the optical length, i represents the number of structural layers in the path through which light passes, and $d_1, d_2, \ldots, d_i$ respectively represent the thicknesses of the respective structure layers in the path through which light passes; $n_1, n_2, \ldots, n_i$ respectively represent the refractive indices of the respective structural layers in the path through which light passes.

By measuring the thicknesses and refractive indices of the respective layers, the optical length of each path can be calculated.

In order to adjust the film layers in the path to meet the above-mentioned requirements of difference values between the optical lengths, it is necessary to firstly determine which film layer(s) among the layers affect the optical length. Although each path passes through a plurality of layers, if two paths include the same film layer(s) with identical material and thickness, the difference value between the optical lengths of these two paths will not be affected by this/these same film layer(s) when calculating the difference value between the optical lengths. Only those film layers made of different materials, or those film layers having the same material but having different thicknesses, would affect the difference value between the optical lengths.

Specifically, as to the path A and the path B, the substrate 001, the encapsulation substrate 010, the light extraction layer 008 and the cathode layer 007 are made of the same materials and have the same thickness, so these layers may not be considered. The layers in the path A that are different from those in the path B are the vacuum gap layer 009 (included in both the path A and the path B, but having different thicknesses), the pixel defining layer 005 (included in the path B, but not in the path A), and the anode layer 0042 (included in the path A, but not in the path B). Since the thickness difference between the vacuum gap layer 009 in the path A and the vacuum gap layer 009 in the path B has the same value as the thickness of the pixel defining layer 005 in the path B, if the thickness of the pixel defining layer 005 is adjusted, the thickness difference between the vacuum gap layer 009 in the path A and the vacuum gap layer 009 in the path B will be adjusted accordingly. It can be seen that the path A and path B are mainly affected by the anode layer 0042 and the pixel defining layer 005. By adjusting the thickness and/or the refractive index of the anode layer 0042, or adjusting the thickness and/or the refractive index of the pixel defining layer 005, or simultaneously adjusting both the anode layer 0042 and the pixel defining layer 005, the difference value between the optical lengths of the path A and the path B can be controlled to deviate from an integer multiple of the wavelength of the light by a deviation value within a preset range.

In the above paths A and B, there is also a difference about the light emitting layer in the light emitting structure layer 006, wherein the light emitting layer in the pixel opening and the light emitting layer outside the pixel opening may be different, and the optical lengths of the paths can be further adjusted by adjusting the light emitting layer. In addition, the film structures of the planarization layer 003 and the laminate layer 002 in the path A and in the path B can also be different, and the optical lengths can be adjusted by adjusting the thickness and/or the refractive index of these different film layers. Since the pixel circuit structure within the inorganic insulating layer of 002 is complicated, a black support layer 0051 can also be disposed on top of the switching device of the pixel circuit, so that light does not pass through the pixel circuit, thereby preventing the light from influencing the performance of the pixel circuit, and at the same time preventing light diffraction caused by the existence of various layers of the pixel circuit.

As to the paths B and C, whose included layers are not repeatedly listed herein, the main difference thereof is that the path C comprises a conductive line 0041, and the thickness of the pixel defining layer 005 in the path C is different from the thickness of the pixel defining layer 005 in the path B. The difference between the thickness of the pixel-defining layer 005 in path C and the thickness of the pixel-defining layer 005 in path B is equal to the thickness of the conductive line 0041. Therefore, by adjusting the thickness and refractive index of the conductive line 0041, the difference value between the optical lengths of the path B and the path C can be made to meet the above requirements. The conductive line in the path C can also be double-layer lines including a first conductive line and a second conductive line, wherein the first conductive line is disposed in the same layer as the first electrode layer, the second conductive line is disposed between the planarization layer and the substrate. By adjusting the thickness and/or the refractive index of the first conductive line and the second conductive line, the difference value between the optical lengths can be controlled to deviate from an integer multiple of the wavelength of the externally incident light by a deviation value within a preset range after the externally incident light passes through the path B and the path C respectively, such that the phase difference is relatively small after light passes through these two paths.

The difference between the path A and the path C lies in the encapsulation layer, the pixel defining layer 005, the anode layer 0042, and the conductive line 0041. The thickness of the encapsulation layer is determined by the thickness of the pixel defining layer 005, therefore the thickness or the refractive index of the layer 005 can be adjusted, or both the thickness and the refractive index of the pixel defining layer 005 are adjusted at the same time. If the anode layer 0042 and the conductive line 0041 are arranged in the same layer, the difference value between the optical lengths of the paths A and C will not be substantially affected by the anode layer 0042 and the conductive line 0041. If the anode layer 0042 and the conductive line 0041 are arranged in different layers, then the difference value between the optical lengths of the path A and the path C can also be adjusted by adjusting the thickness and/or the refractive index of the anode layer 0042 and the conductive line 0041.

The difference between path A and path D lies in the encapsulation layer and the pixel defining layer 005. The thickness of the encapsulation layer is determined by the thickness of the pixel defining layer 005, so the thickness or the refractive index of the pixel defining layer 005 can be adjusted, or both the thickness and the refractive index of the pixel defining layer 005 can be adjusted at the same time, so as to adjust the difference value between the optical lengths of the paths A and D.

The difference between path B and path D is the pixel defining layer 005 and the anode layer 0042, so the thickness and/or refractive index of the pixel defining layer 005 and the anode layer 0042 can be adjusted to adjust the difference value between the optical lengths of the paths B and D.

The difference between path C and path D lies in the anode layer 0042 and the conductive line 0041. If the anode layer 0042 and the conductive line 0041 are arranged in the same layer, the optical lengths of the path A and the path C are the same, and there is no difference between the optical lengths thereof. If the anode layer 0042 and the conductive line 0041 are arranged in different layers, the difference value between the optical lengths of the path C and the path D can also be adjusted by adjusting the thickness and/or the refractive index of the anode layer 0042 and the conductive line 0041.

When the support layer 0051 is a transparent structure, the path B, the path C and the path D can comprise a support layer, and the path B, the path C and the path D may further comprise a TFT structure layer forming a pixel circuit. Since the TFT structure layer comprises a plurality of layers, different layers of the TFT structure will exist in the path B, the path C, and the path D according to the specific structural arrangements. Since the support layer 0051 is disposed on the pixel defining layer 005, the support layer 0051 does not exist in the path A.

The conductive line in the above embodiment can be a single-layer conductive line or a multilayer conductive line. The conductive line is selected from at least one of a scan line, a data line, a power line, and a reset line. The scan line may include a SCAN line and an EM line. The data line is $V_{data}$, the power line is VDD or VSS, and the reset line is $V_{ref}$. In other embodiments, the conductive line can also be a double-layer line, for example the double-layer line comprises a first conductive line and a second conductive line, wherein the first conductive line is disposed in the same layer as the anode layer, and the second conductive line is disposed between the planarization layer and the substrate. The first conductive line and the second conductive line are made of the same material as the first electrode layer (anode layer), thus, the encapsulation layer, the second electrode layer (cathode layer), the pixel defining layer, the first conductive line and the substrate form an optical path; the encapsulation layer, the second electrode layer (cathode layer), the pixel defining layer, the second conductive line and the substrate can form another optical path; and in a portion where projections of the first conductive line and the second conductive line overlap, the encapsulation layer, the second electrode layer (cathode layer), the pixel defining layer, the first conductive line, the second conductive line and the substrate can form still another optical path. In a specific embodiment, when a projection of the conductive line on the substrate partially overlaps with a projection of the first electrode layer (anode layer) on the substrate, the paths through which the light passes may include a seventh path comprising an encapsulation layer, a second electrode layer (cathode layer), a light emitting layer, a first electrode layer (anode layer), a second conductive line, and a substrate.

With reference to FIG. 6, based on the above embodiments, in an AMOLED display panel disclosed in another embodiment of the present application, preferably, the thickness of the anode layer 0042 in the path A and the thickness of the pixel defining layer 005 in the path C are adjusted, so that the optical lengths of the paths A and the path C are the same.

Figure 7:
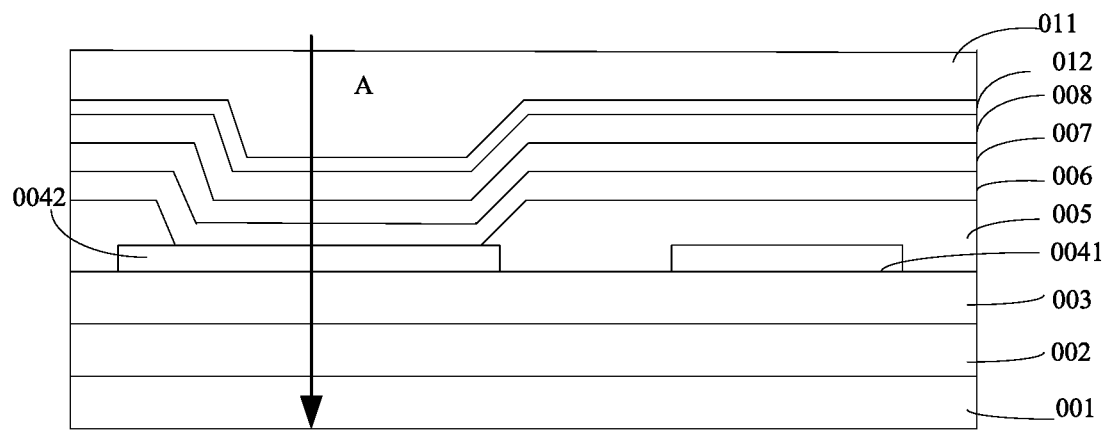
FIG. 7 is a structural view of a display panel in another embodiment of the present application.

In addition to the above-mentioned hard encapsulation method, a thin film encapsulation method can also be adopted. As shown in FIG. 7, an outer side of the light extraction layer 008 is thin-film encapsulated to form a thin-film encapsulation layer. The thin-film encapsulation layer comprises an inorganic material encapsulation layer 012 and an organic material encapsulation layer 011, and the inorganic material encapsulation layer 012 is disposed on the entire surface and has a uniform thickness, so the inorganic material encapsulation layer 012 has no effect on the difference value between the optical lengths of the paths. The organic material encapsulation layer 011 fills the pixel opening fully. After fully filling the pixel opening, an overall encapsulation layer is formed. Therefore, in different paths, the thickness of the organic material encapsulation layer is different. Therefore, the optical lengths of the paths to be passed through by light can be adjusted by adjusting the thickness of the organic material encapsulation layer 011 within the pixel opening, or by adjusting the refractive index of the organic material encapsulation layer, or by adjusting both the thickness and the refractive index of the organic material encapsulation layer at the same time, or by the above means in combination with other adjustment manners. The thickness of the organic material encapsulation layer in the path A is greater than the thickness of the organic material encapsulation layer in other paths.

In summary, a plurality of light-transmitting paths can be formed in the display panel when light passes through the display panel. The paths may include a path comprising an encapsulation layer, a second electrode layer, a light emitting structure layer, a first electrode layer and a substrate; and/or the paths may include a path comprising an encapsulation layer, a second electrode layer, a light emitting structure layer, a pixel defining layer and a substrate; and/or the paths may include a path comprising an encapsulation layer, a second electrode layer, a light-emitting structure layer, a pixel-defining layer, a conductive line and a substrate. There may be more paths formed if the distribution of multiple conductive lines at different locations and the distribution of pixel circuits at different locations are considered. According to the idea of the present application, as long as the thickness and/or the refractive index of one or more film layers which are different from each other in the respective different paths are adjusted to realize that the difference value between the optical lengths of at least two paths deviates from an integer multiple of the wavelength of the light by a deviation value within a preset range, diffraction of light after passing through the at least two paths can be alleviated. When there are more paths meeting such condition, the diffraction would be further weakened. Optionally, one or more difference values between the optical lengths can be controlled to deviate from an integer multiple of the wavelength of the light by a deviation value within a preset range by adjusting the thickness and/or the refractive index of one or more layers selected from the encapsulation layer, the light-emitting structure layer, the first electrode layer, the pixel-defining layer, the insulating layer, and the conductive line. The specific adjustment manners have been respectively described in the above embodiments, which will not be repeatedly described herein.

Figure 12:
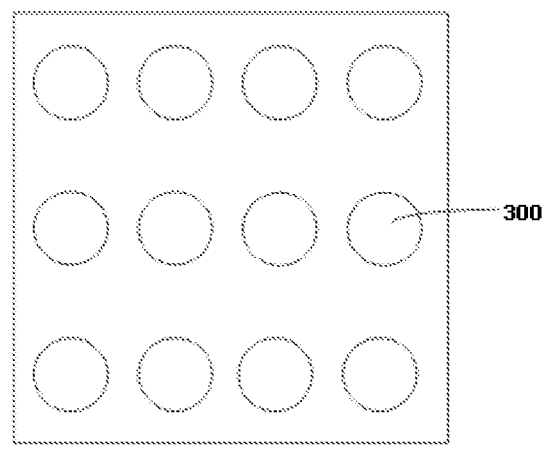
FIG. 12 is a top view of anodes in an AMOLED display panel in an embodiment of the present application.
Figure 13:
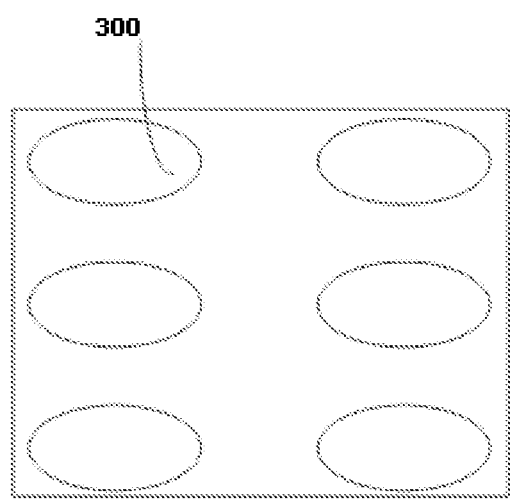
FIG. 13 is a top view of anodes in an AMOLED display panel in another embodiment of the present application, with shape of anodes different from that of FIG. 12.
Figure 14:
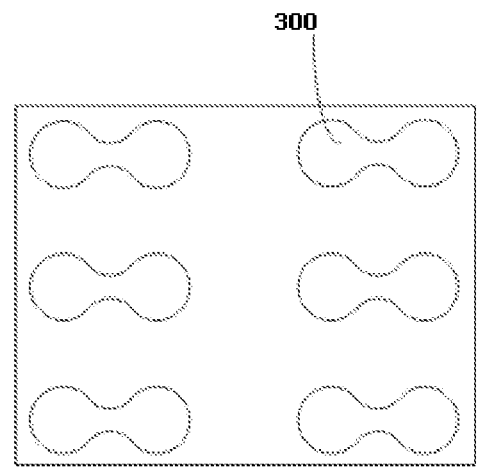
FIG. 14 is a top view of anodes in an AMOLED display panel in another embodiment of the present application, with shape of anodes different from that of FIG. 12.

For the AMOLED display screen in the above embodiments, in order to further alleviate the diffraction generated in a lateral direction, the shapes of the electrodes in the anode layer, the pixel openings and the conductive line can be adjusted to further alleviate diffraction. In the AMOLED display screen, the anode 300 can be set to have a circular shape as shown in FIG. 12, or an oval shape as shown in FIG. 13, or a dumbbell shape as shown in FIG. 14. In addition, the anode can also be formed by other types of curves with different curvature radii. When light passes through obstacles such as slits, small holes, or disks, it will bend at different degrees in its transmission direction and deviate from a rectilinear transmission direction. This phenomenon is called diffraction. During the diffraction process, the distribution of diffraction fringes is affected by the size of the obstacle, such as the width of the slit and the size of the small hole. The diffraction fringes at locations having the same width are consistent, which will cause more notable diffraction effects. By changing the shape of the anode to a circular shape, an oval shape or a dumbbell shape, it can be ensured that, when light passes through the anode layer, diffraction fringes with different positions and diffusion directions can be generated at locations of the anode with different widths, thereby weakening the diffraction effect and ensuring that the images captured by a camera arranged below the display panel have a higher clarity.

In order to further alleviate the diffraction, the sides of a projection of the opening of the pixel defining layer 005 on the substrate are not parallel to each other and each side thereof has a curve shape, that is, the opening has varying widths in all directions and has different diffusion directions of diffraction at the same location. When external light passes through the opening, diffraction fringes having different positions and diffusion directions can be generated at the locations with different widths, thereby preventing any notable diffraction effect, and ensuring that a photosensitive device disposed below the display panel can work normally.

In related art, the openings in the pixel-defining layer are all set to have a rectangular shape or a square shape according to the pixel size. For example, when the opening has a rectangular shape, since the rectangular shape has two sets of parallel sides, the rectangular shape has the same size in both the length direction and the width direction. Therefore, when external light passes through the opening, diffraction fringes having the same position and the same diffusion direction are generated at all the different locations in the length direction or the width direction, thus a significant diffraction effect may occur, making the photosensitive device below the display panel unable to work normally. This problem can be well solved by the display panel of the present embodiment which can ensure that the photosensitive device below the display panel can work normally.

In an optional embodiment, each side of a projection of the opening on the substrate may have a shape selected from at least one of a circular shape, an oval shape and other curves with varying curvature. The sides of the opening have a curve shape. Therefore, when light passes through the opening, the diffraction fringes generated will not diffuse only in one direction, but will diffuse in 360-degree directions, which makes the diffraction extremely insignificant and leads to a better diffraction alleviation effect.

In an optional embodiment, a projection shape unit of the opening on the substrate has a circular shape, an oval shape, a dumbbell shape or a wavy shape, which is similar to the shape of the anode 300, and can refer to the shapes of the anode 300 shown in FIGS. 12-14, and which is not repeatedly described herein. The shape of the projection of the opening on the substrate can be determined according to the shape of the corresponding light emitting structure. For example, the number of shape units can be determined according to the aspect ratio of the light emitting structure. In one embodiment, a projection of the opening on the substrate may have an axisymmetric structure, so as to ensure that each pixel on the entire display panel has a uniform aperture ratio and not to affect the final display effect. As shown in FIG. 12, when the projection of the opening on the substrate has a circular shape, the corresponding light-emitting structure has a rectangular or square shape with an aspect ratio less than 1.5, and the symmetry axis of the projection of the opening corresponds to the symmetry axis of the corresponding light-emitting structure. A diameter of the circle of the projection is smaller than the minimum width of the light emitting structure. Specifically, the diameter of the circle of the projection can be determined according to the shape of the light emitting structure in combination with the aperture ratio. Since the method for determining the size of the opening in the related technology can be used in the determination process herein, it is not described herein. The pixel opening and the anode electrode can also be eccentric with respect to each other, that is, the circle center of the pixel opening and the circle center of the anode electrode do not coincide.

When an aspect ratio of the sub-pixel corresponding to the opening is between 1.5 and 2.5, the projection of the opening has a dumbbell shape formed by interconnecting two circles to each other. The two circles are respectively arranged along a length direction of the corresponding light emitting structure. In an embodiment, there is a connecting portion between the two circles, and both sides of the connecting portion have a curve shape. When light passes through the connecting portion, it can also be ensured that the light can be diffused towards different directions, thereby alleviating the diffraction effect.

When an aspect ratio of the light emitting structure corresponding to the opening is greater than 2.5, the projection of the opening has a wave shape formed by interconnecting three or more circles with each other. The three or more circles are respectively arranged along a length direction of the corresponding light-emitting structure. In one embodiment, connecting portions are further formed in the projection. The connecting portions have an arc shape, that is, the intersections of the three or more circles are interconnected by arcs, so that, when light passes through the connecting portion, it can also be diffused towards different directions, thereby alleviating the diffraction effect.

Figure 15:
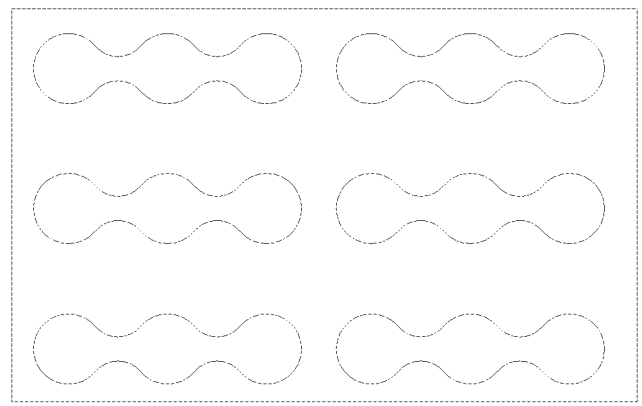
FIG. 15 is a top view of a projection of openings in a pixel-defining layer in an embodiment of the present application.
Figure 16:
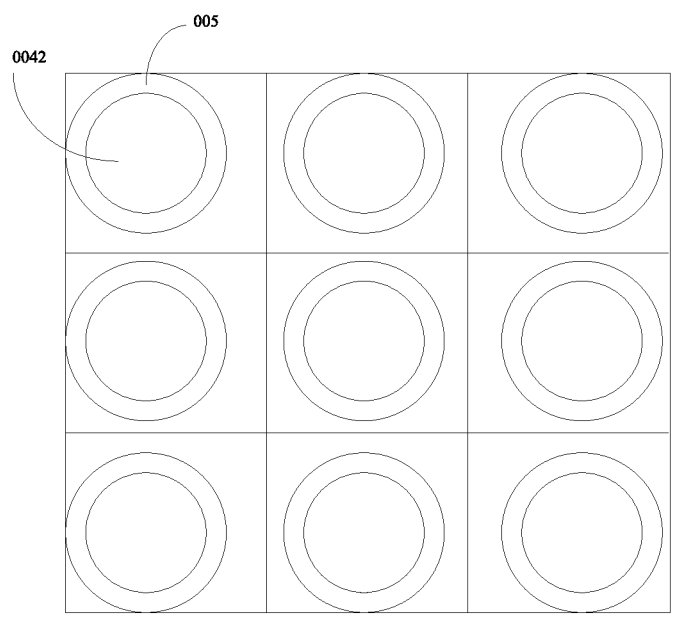
FIG. 16 is a top view of a projection of openings of a pixel defining layer and anodes in another embodiment of the present application.

When the aspect ratio of the light-emitting structure corresponding to the opening is equal to 1.5, the projection of the opening may have a circular shape, or may have a dumbbell shape that are formed by two circles interconnected to each other. When the aspect ratio of the light-emitting structure corresponding to the opening is equal to 2.5, the projection may have a dumbbell shape formed by two circles interconnected to each other, or may have a wave shape formed by three circles interconnected with each other, as shown in FIG. 15. When the anode layer 004 has a circular shape, the pixel opening 005 may also have a circular shape, as shown in FIG. 16.

Figure 8:
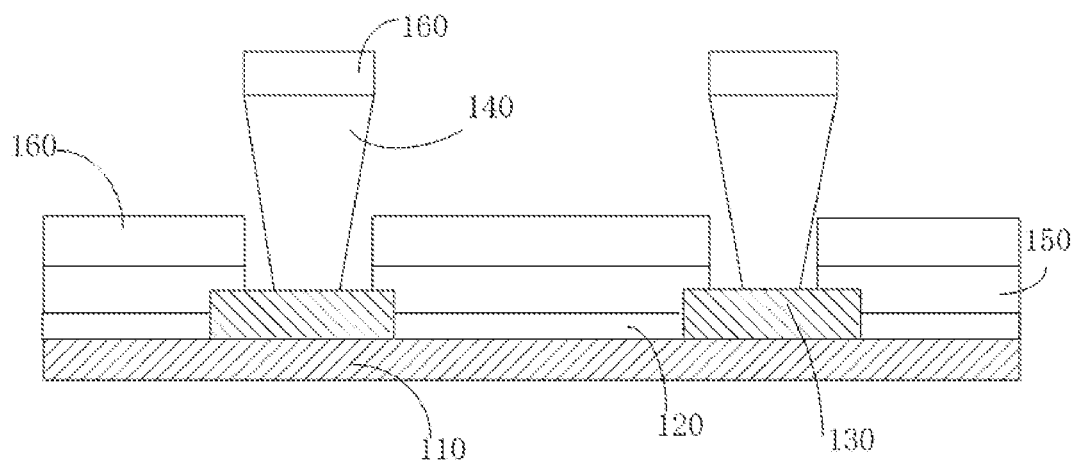
FIG. 8 is a schematic structural view of a cathode of a display panel in an embodiment of the present application.
Figure 9:
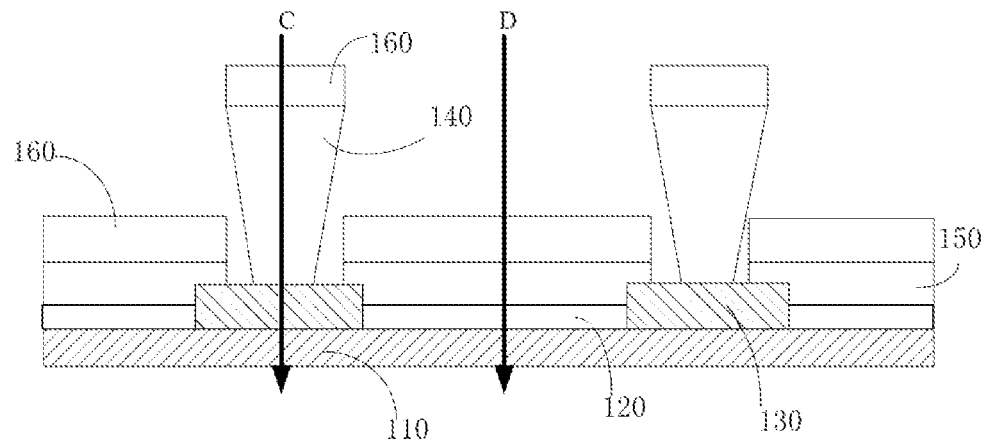
FIG. 9 is a schematic structural view of light passing through a cathode in an embodiment of the present application.

In another embodiment, the display panel can be PMOLED. Since the PMOLED and the AMOLED have different structures, when light passes through PMOLED, there are different paths to be formed. As shown in FIG. 8, the PMOLED comprises a substrate 110, an anode layer 120, a pixel defining layer 130, an isolation pillar 140, a light emitting structure layer 150, and a cathode layer 160. The anode layer 120 comprises a plurality of first electrodes, and a plurality of anodes are regularly arranged on the substrate 110. A light emitting structure layer 150 is formed on the anode, and a cathode layer 160 is formed on the light emitting structure layer 150. The isolation pillar 140 is formed on the pixel defining layer 130 and is disposed between adjacent first electrodes. The isolation pillar 140 is used to separate the cathodes of two adjacent sub-pixel regions. As shown in FIG. 8, the isolation pillar 140 has an inverted trapezoidal structure and made of a transparent material, such as transparent photoresist. The surface of the isolation pillar 140 is higher than the surface of the regions adjacent to the isolation pillar 140. Therefore, when a cathode is prepared on the surface of the display panel, the cathode formed above the isolation pillar 140 is disconnected from the cathode on the pixel regions adjacent to the isolation pillar 140, thereby realizing separation of the cathodes of adjacent sub-pixel regions, which ultimately ensures that each sub-pixel region can be driven normally. Since the PMOLED further comprises the isolation pillars 140, the paths through which light passes also include a path comprising the isolation pillars 140. As shown in FIG. 9, the path C comprises the cathode layer 160, the isolation pillar 140, the pixel defining layer 130 and the substrate 110, and the path D comprises the cathode layer 160, the light emitting structure layer 150, the anode layer 120 and the substrate 110. In the path C and the path D, different film layers include an isolation pillar 140, a pixel defining layer 130, a light emitting structure layer 150, and an anode layer 120. By adjusting the thickness and/or the refractive index of one or more of these layers, the difference value between the optical lengths of the path C and the path D to be passed through by light can be adjusted. In each path, the optical length of the path to be passed through by light can be adjusted by adjusting the thickness and/or the refractive index of the layers that are different in the respective paths. Other adjustment methods of the paths are the same as those in the foregoing embodiments, and details thereof are not repeatedly described herein. The path A, the path B, the path C, and the path D in the above embodiments may also be referred to as a first path, a second path, a third path, a fourth path, and the like.

As a specific embodiment, the above-mentioned light is visible light, and the wavelength of the light is 380-780 nanometers, preferably the wavelength of the light is 500-600 nanometers, and human eyes are more sensitive to the light in this preferable range (i.e., green light). Since human eyes are most sensitive to green light, the incident light can be selected to be based on green light, that is, when adjusting the optical length of each path to be passed through by light, $\lambda$ can be selected from wavelengths of 500 nm to 560 nm of green light, such as 540 nm, 550 nm, 560 nm. Since the wavelength of green light is between red light and blue light, the red light and blue light can also be taken into account when green light is selected.

The inventors further found out by research that, when external light passes through patterns in the display panel area, lateral diffraction may also occur, which causes diffraction fringes and in turn affects the normal operation of photosensitive devices such as cameras.

Figure 10:
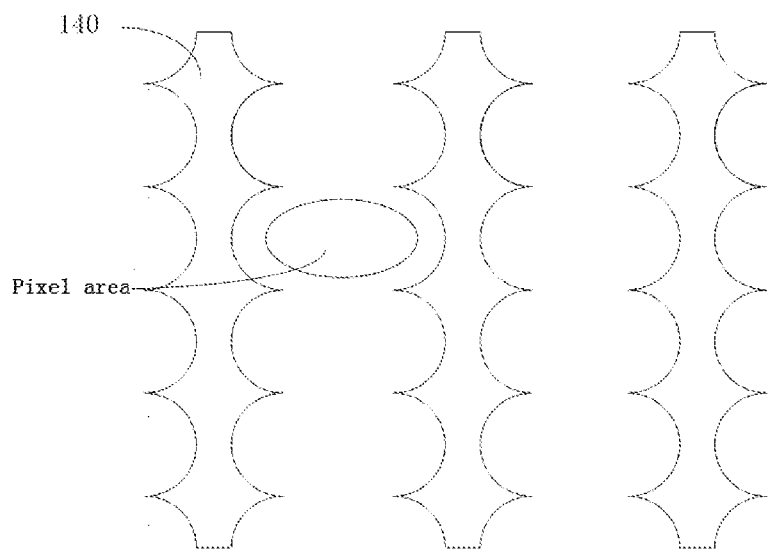
FIG. 10 is a top view of a first type isolation column in an embodiment of the present application.
Figure 11:
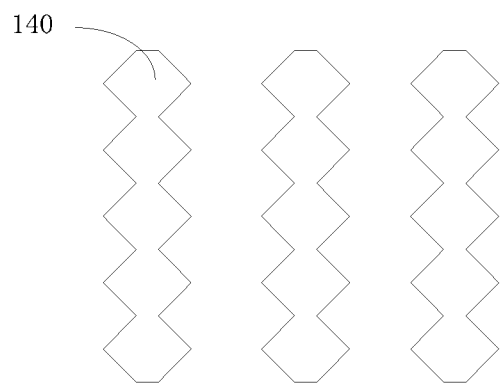
FIG. 11 is a top view of a first type isolation column in another embodiment of the present application.

In order to prevent or alleviate the diffraction phenomenon caused by the above reason, the isolation pillar 140 includes a plurality of first type isolation pillars. In an extending direction of the first type isolation pillars, the width of the first type isolation pillars changes continuously or intermittently, wherein said extending direction is parallel to the substrate; and said width is a size of a projection of the first type isolation pillar on the substrate in a direction perpendicular to the extending direction. FIG. 10 is a schematic structural view of a first type isolation pillar in an embodiment. In the extending direction of the first type isolation pillars, the width of the first type isolation pillars continuously changes. When external light passes through the first type isolation pillar, the positions of diffraction fringes generated at locations of different maximum widths are different, thereby making the diffraction less notable and achieving the effect of alleviating diffraction. FIG. 11 is a top view of a first type isolation pillar in another embodiment, that is, a schematic view of a top surface structure thereof. In this embodiment, a non-rectilinear shape is formed by connecting the ends of multiple polygonal line segments, thereby ensuring that the first type isolation pillar has varying widths along the extending direction thereof to alleviate the diffraction effect. In this embodiment, the notches formed by the polygonal line segments are disposed toward the sub-pixel area to reduce the impact on the pixels and ensure that the brightness of the pixels can meet the requirements while ensuring the pixel aperture ratio. In other embodiments, the polygonal line segments corresponding to each pixel area may also be composed of even more segments, thereby forming a jagged edge.

Figure 17:
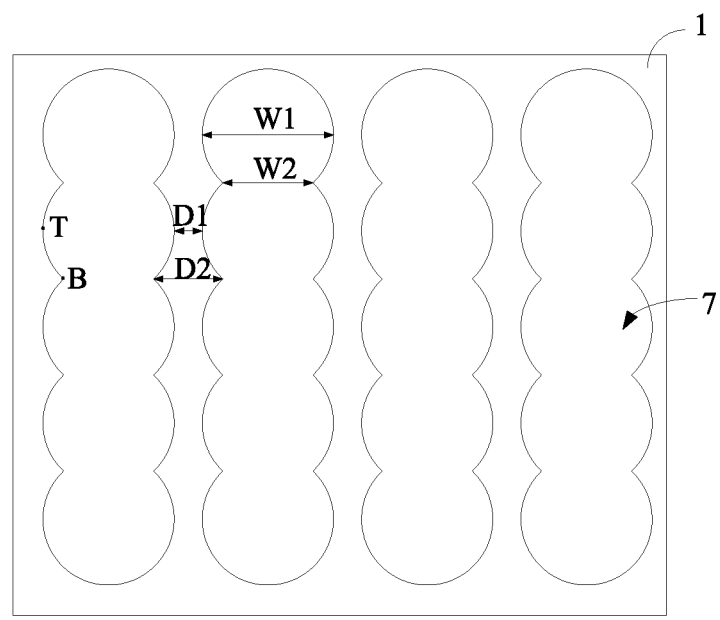
FIG. 17 is a top view of an electrode pattern of a PMOLED display panel in an embodiment of the present application.

In order to further alleviate diffraction, both sides in an extending direction of the anode and the cathode in the PMOLED have a wave shape, and the wave crests of the two sides are oppositely disposed and the wave troughs of the two sides are oppositely disposed, as shown in FIG. 17. Further, the wave crests and wave troughs of two adjacent electrodes may be staggered with one another.

Figure 18:
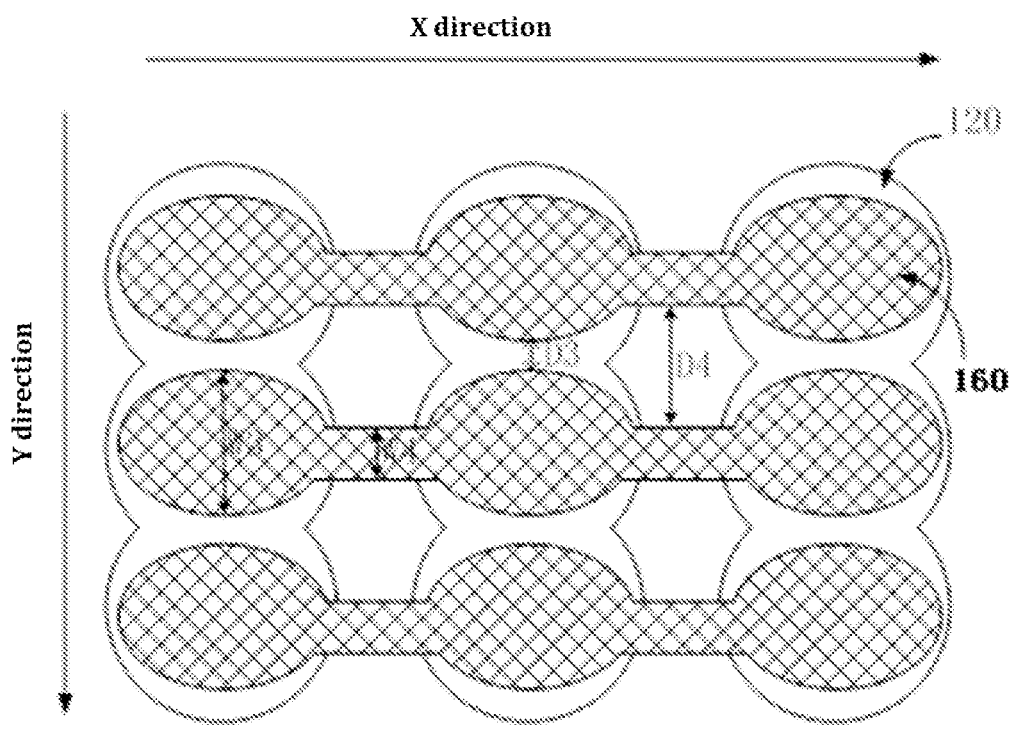
FIG. 18 is a top view of patterns of anodes and cathodes of a PMOLED display panel in an embodiment of the present application.

Both the anode and the cathode can have a wavy-striped shape. As shown in FIG. 18, an extending direction of the second electrode 160 and an extending direction of the first electrode 120 are perpendicular to each other, thereby forming a light-emitting area of the display panel in the overlapping area. The first electrode 120 is an anode, and the second electrode 160 is a cathode. In this embodiment, each anode is used to drive one row/column or multiple rows/columns of sub-pixels. Generally, a pixel (or pixel unit) includes at least three sub-pixels of red, green and blue colors. In other embodiments, one pixel unit may also include four sub-pixels of red, green, blue and white colors. The arrangement of the sub-pixels can be a juxtaposed arrangement of RGB sub-pixels, a V-shaped arrangement, or a PenTile arrangement. In the present application, pixel units arranged in juxtaposed arrangement of RGB sub-pixels are taken as an example for illustration. It can be understood that the display panel in this embodiment can also be applied to arrangements other than the juxtaposed RGB sub-pixel arrangement. In other embodiments, the number of columns/rows of pixels driven by each cathode is M, and the number of columns/rows of pixels driven by each anode is N, wherein M should be greater than or equal to 3N. Specifically, one pixel unit is constituted by using RBG sub-pixels, and the number of columns/rows of sub-pixels driven by each cathode is M which equals to 3N. In other embodiments, if RGBW sub-pixels form a pixel unit, the number of column/row of sub-pixels driven by each cathode is M which equals to 4N. It can be understood that, in other embodiments, the pixels in a column can be driven by the cathode and the pixels in a row can be driven by the anode, wherein the only difference is the different arrangement directions of the anodes and the cathodes.

Figure 19:
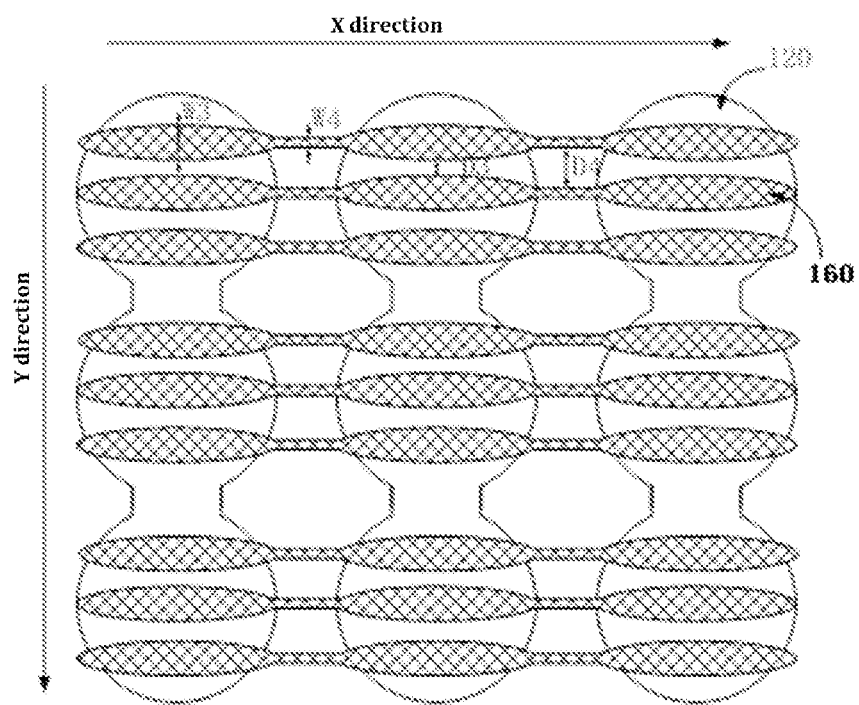
FIG. 19 is a top view of patterns of cathodes and anodes of a PMOLED display panel in another embodiment of the present application.

FIG. 19 is a schematic structural view of cathodes and anodes in a PMOLED display panel according to another embodiment. In this embodiment, one pixel unit includes three sub-pixels of red, green and blue colors. Therefore, each anode 120 is used to drive a column of pixel units, and each cathode 160 is used to drive a row of sub-pixels. The anode pattern can refer to FIG. 17, that is, the width W1 between the oppositely disposed wave crests T is 30 μm to (A-X)μm, the width W2 between the oppositely disposed wave troughs B is Xμm to W1, and the minimum distance D1 is (A-W1), the maximum distance D2 is (A-W2). X is the minimum process dimension.

As shown in FIG. 19, the width W3 between the oppositely disposed wave crests of the two sides of the cathode is Xμm to ((A-X)/3)μm. It can be understood that, in other embodiments, when the number of sub-pixels in one pixel unit is N, the width W3 between the oppositely disposed wave crests of the two sides of the cathode 160 is Xμm to ((A-X)/N)μm. In this embodiment, the width W4 between the oppositely disposed wave troughs of the two sides of the cathode 160 is Xμm to W1, the minimum distance D3 is (A-W3), and the maximum distance D4 is (A-W4), wherein A represents a pixel size and X is a minimum process dimension. In the above embodiments, the distances between adjacent electrodes are all between 4 μm and 20 μm.

Figure 20:
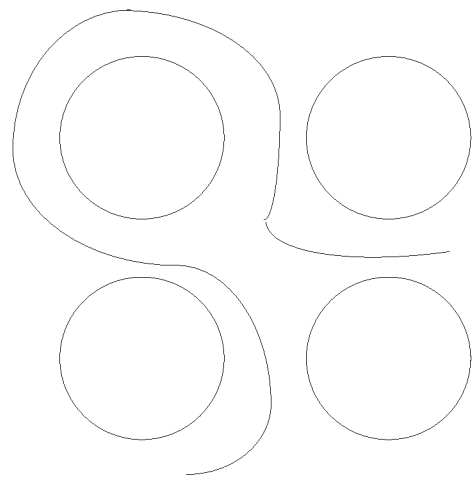
FIG. 20 is a top view of a conductive wire extending in a curve around the edge of the first electrode in an embodiment of the present application.

For AMOLED display panels and PMOLED display panels, the conductive lines are curved in an extending direction thereof; the conductive lines are provided around the first electrodes, and the conductive lines extend in a curve around the edges of the first electrodes, as shown in FIG. 20. Both sides of the conductive line in the extending direction thereof have a wave shape, and the wave crests of the two sides are oppositely disposed, and the wave troughs of the two sides are oppositely disposed, as shown in FIG. 17. As shown in FIG. 20, when there are transparent electrode wirings, the wirings are designed to extend in a curve in accordance with the size of the pixel electrode, which can further eliminate diffraction as compared to the traditional straight wirings.

Figure 21:
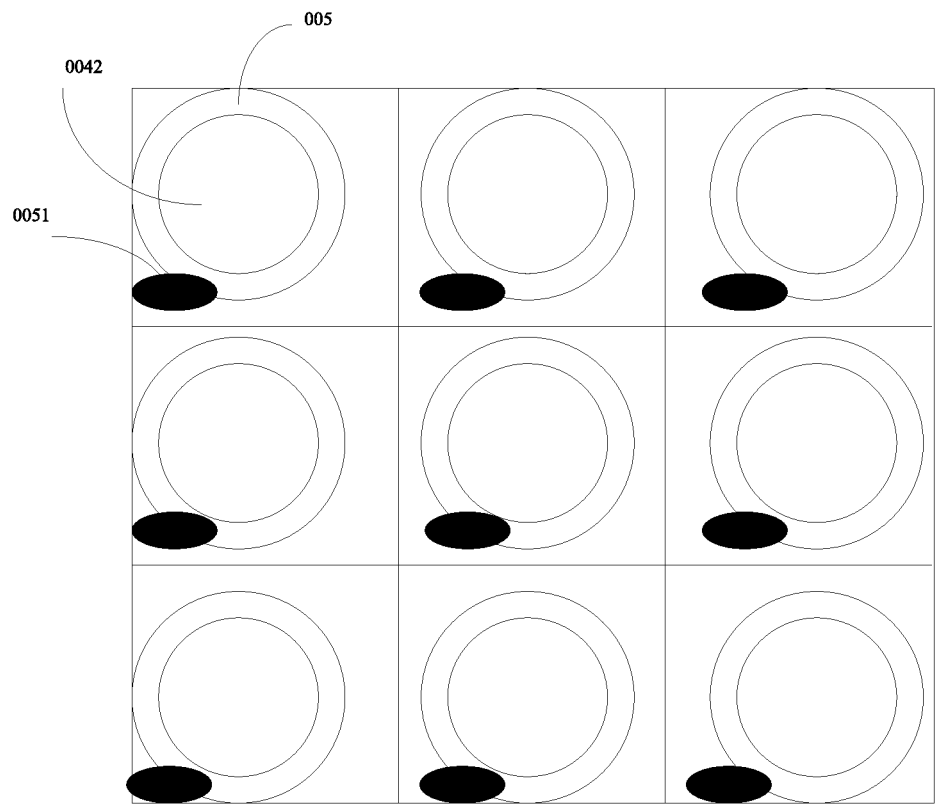
FIG. 21 is a top view of an opaque support layer arranged in an oval shape in an embodiment of the present application.

In addition, when there are non-transparent areas in the display panel, the non-transparent areas can be designed to have a circular shape or an oval shape to alleviate diffraction. Therefore, the opaque support layer 0051 can also be designed to have a circular shape or an oval shape. As shown in FIG. 21, by making the support layer 0051 to have an oval shape, the diffraction can be further alleviated.

Figure 22:
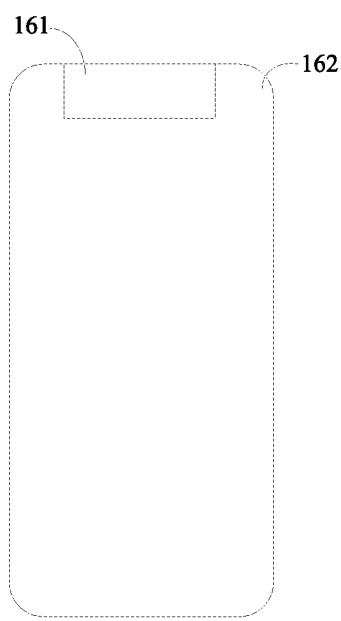
FIG. 22 is a structural schematic view of a display screen in an embodiment of the present application.

The embodiments of the present application also provide a display screen, as shown in FIG. 22, the display screen comprises a first display area 161 and a second display area 162, the first display area 161 and the second display area 162 are both used to display static or dynamic images, the display panel mentioned in any of the above embodiments is used in the first display area 161, and the first display area 161 is located at an upper part of the display screen. In the above display panel, after light passes through the display panel via at least two of the paths, it will not cause phase difference, so that diffraction interference is alleviated. If the phase position do not change after light passes through all the paths in the display panel, diffraction interference caused by the phase difference can be prevented, and the camera below the screen can capture clear and real image information.

In an alternative embodiment, the display screen may comprise three or more display areas, such as three display areas (a first display area, a second display area, and a third display area). The display panel mentioned in any of the above embodiments can be used in the first display area, and display panels used in the second display area and the third display area are not limited herein and these display panels can be a PMOLED display panel or an AMOLED display panel, and certainly the display panel of any of the above embodiments can also be used.

The embodiments of the present application further provide a display apparatus, comprising the above-mentioned display screen overlaid on an apparatus body. The display apparatus may be a product or a component having a display function, such as a mobile phone, a tablet PC, a television, a display screen, a palmtop computer, an iPod, a digital camera, a navigator, or the like.

Figure 23:
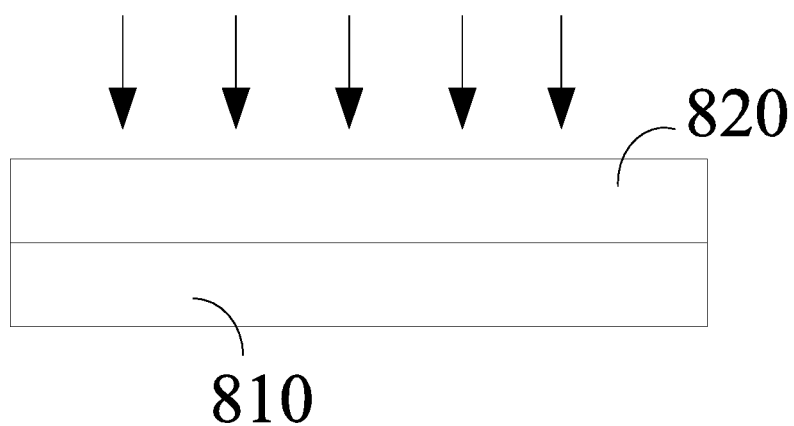
FIG. 23 is a schematic view of a terminal structure in an embodiment of the present application.

FIG. 23 shows a schematic structural view of a display terminal in an embodiment, the display terminal comprises an apparatus body 810 and a display screen 820. The display screen 820 is disposed on the apparatus body 810 and is interconnected with the apparatus body 810. The display screen 820 can be the display screen in any of the above embodiments for displaying a static or dynamic picture.

Figure 24:
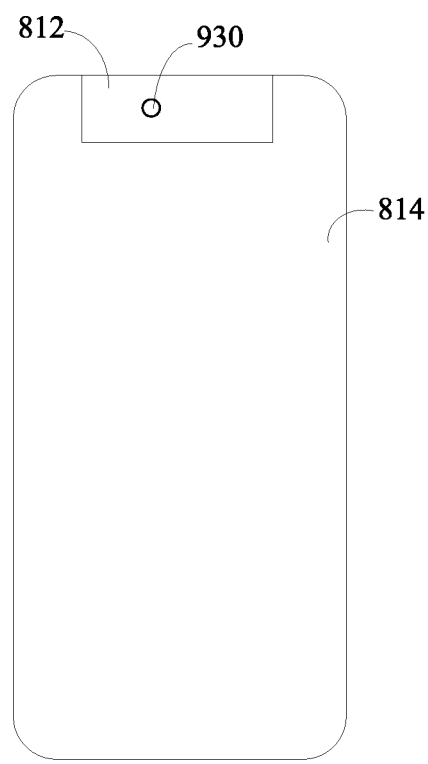
FIG. 24 is a schematic view of an apparatus body according to an embodiment of the present application.

FIG. 24 shows a schematic structural view of an apparatus body 810 in an embodiment. In this embodiment, the apparatus body 810 can be provided with a slotted area 812 and a non-slotted area 814. A photosensitive device such as a camera 930 and a light sensor may be disposed in the slotted area 812. At this time, the display panel of the first display area of the display screen 820 is attached correspondingly to the slotted area 812 so that the above-mentioned photosensitive device such as the camera 930 and the light sensor can collect external light through the first display area. Since the display panel in the first display area can effectively alleviate the diffraction phenomenon generated by external light passing through the first display area, the quality of the image captured by the camera 930 on the display apparatus can be effectively improved, image distortion of the captured image due to diffraction can be prevented, and the accuracy and sensitivity of the light sensor for sensing external light can also be improved.

Although the embodiments of the present application have been described with reference to the appended drawings, various modifications and variations can be made by a person skilled in the art without departing from the gist and scope of the present application. Such modifications and variations fall within the scope defined by the attached claims.

What is claimed is:

1. A display panel, comprising:
a substrate; and
a plurality of film layers disposed on the substrate in sequence, and at least one of the plurality of film layers having a patterned structure;
wherein the display panel comprises at least a first location and a second location different from the first location, and first film layers arranged in a thickness direction of the display panel at the first location are different from second film layers arranged in a thickness direction of the display panel at the second location, the first film layers arranged in the thickness direction of the display panel at the first location having a total number of i and respective thicknesses of $d_1$, $d_2$, ... $d_i$, the second film layers arranged in the thickness direction of the display panel at the second location having a total number of j and respective thicknesses of $D_1$, $D_2$, ... $D_j$; i and j are natural numbers;
wherein a first optical length $L_1$ at the first location and a second optical length $L_2$ at the second location meet the following conditions:

$$L_1 = d_1 * n_1 + d_2 * n_2 + \ldots + d_i * n_i,$$

$$L_2 = D_1 * N_1 + D_2 * \ldots + D_j * N_j,$$

$$(m-\delta)\lambda \leq L_1 - L_2 \leq (m+\delta)\lambda,$$

wherein, $n_1, n_2, \ldots, n_i$ are film layer coefficients corresponding to the first film layers arranged in the thickness direction of the display panel at the first location; $N_1, N_2, \ldots, N_j$ are film layer coefficients corresponding to the second film layers arranged in the thickness direction of the display panel at the second location; $n_1, n_2, \ldots, n_i$ and $N_1, N_2, \ldots N_j$ are constants between 1 and 2; $\lambda$ is a constant between 380 nm and 780 nm; m is a natural number; and $\delta$ is a constant between 0 and 0.2,
the display panel is an active matrix organic light emitting diode display panel or a passive matrix organic light emitting diode display panel, and the plurality of film layers comprise an encapsulation layer, a second electrode layer, a light emitting layer, a first electrode layer, and a pixel defining layer;
the first film layers arranged in the thickness direction of the display panel at the first location form a first path, and the second film layers arranged in the thickness direction of the display panel at the second location form a second path or a third path, wherein, the first path comprises the encapsulation layer, the second electrode layer, the light emitting layer, the first electrode layer, and the substrate;

the second path comprises the encapsulation layer, the second electrode layer, the pixel defining layer, the first electrode layer, and the substrate; and the third path comprises the encapsulation layer, the second electrode layer, the pixel defining layer, and the substrate.

2. The display panel according to claim 1, wherein:
$\lambda$ represents a wavelength of visible light, $n_1, n_2, \ldots, n_i$ and $N_1, N_2, \ldots, N_j$ represent refractive indices of the corresponding film layers at the wavelength of visible light.

3. The display panel according to claim 1, wherein:
$L_1-L_2$ has a value of 0.

4. The display panel according to claim 1, wherein,
the display panel is a film-encapsulated flexible screen or a film-encapsulated hard screen, the encapsulation layer comprises a thin film encapsulation layer, the thin film encapsulation layer comprises an organic material encapsulation layer, and the thickness of the organic material encapsulation layer in the first path is greater than the thickness of the organic material encapsulation layer in other paths.

5. The display panel according to claim 1, wherein,
the display panel is a hard screen encapsulated with glass powder, the encapsulation layer comprises a vacuum gap layer and an encapsulation substrate, and the thickness of the vacuum gap layer in the first path is greater than the thickness of the vacuum gap layer in other paths.

6. The display panel according to claim 1, wherein
the display panel is an active matrix organic light emitting diode display panel, and the plurality of film layers further comprise a conductive line,
the first film layers or the second film layers also form a fourth path comprising the encapsulation layer, the second electrode layer, the pixel defining layer, the conductive line and the substrate.

7. The display panel according to claim 6, wherein
the conductive line is a single-layer line, the conductive line is disposed in the same layer as the first electrode layer, and the conductive line and the first electrode layer are made of the same material, and the fourth path and the second path comprise the same film layers with the same thicknesses; or
the conductive line is a multilayer line, and at least one layer of the multilayer line is disposed in the same layer as the first electrode layer, and the conductive line and the first electrode layer are made of the same material or different materials.

8. The display panel according to claim 7, wherein
the conductive line is a double-layer line comprising a first conductive line and a second conductive line, the first conductive line is disposed in the same layer as the first electrode layer, and the plurality of film layers further include a planarization layer, and the second conductive line is disposed between the planarization layer and the substrate, and the first conductive line and the second conductive line are made of the same material as the first electrode layer, and the fourth path comprises the encapsulation layer, the second electrode layer, the pixel defining layer, the first conductive line and/or the second conductive line, and the substrate.

9. The display panel according to claim 8, wherein
when a projection of the conductive line on the substrate partially overlaps a projection of the first electrode layer on the substrate, the plurality of film layers also form a fifth path comprising the encapsulation layer, the second electrode layer, the light emitting layer, the first electrode layer, the second conductive line and the substrate.

10. The display panel according to claim 7, wherein:
the conductive line is curvilinear in an extending direction thereof; the conductive line is provided around the first electrode, and the conductive line extends in a curve around an edge of the first electrode.

11. The display panel according to claim 6, wherein
the display panel is an active matrix organic light emitting diode display panel, and the plurality of film layers further comprise a support layer disposed on the pixel defining layer and a thin film transistor structure layer for making a pixel circuit, and
the support layer is a transparent structure, and at least one of the second path, the third path and the fourth path further comprises the support layer and/or the thin film transistor structure layer.

12. The display panel according to claim 1, wherein,
the display panel is an active matrix organic light emitting diode display panel, and the plurality of film layers further comprise a support layer disposed on the pixel defining layer and a thin film transistor structure layer for making a pixel circuit, and
the support layer is an opaque structure, and the thin film transistor structure layer is disposed beneath the support layer.

13. The display panel according to claim 1, wherein
pixel openings are formed in the pixel defining layer, the pixel openings comprise a first type of pixel openings; and each side of a projection of each of the first type of pixel openings on the substrate has a curved shape and is not parallel to each other.

14. The display panel according to claim 1, wherein,
the display panel is a passive matrix organic light emitting diode display panel, and the plurality of film layers further comprise an isolation pillar disposed on the pixel defining layer, and the plurality of film layers also form a sixth path comprising the second electrode layer, the isolation pillar, the pixel defining layer and the substrate, and the isolation pillar comprises transparent material.

15. The display panel according to claim 14, wherein:
the isolation pillar comprises a plurality of first type isolation pillars; and the width of each of the plurality of first type isolation pillars changes continuously or intermittently in an extending direction thereof parallel to the substrate; and the width refers to a dimension of a projection of each of the plurality of first type isolation pillars on the substrate in a direction perpendicular to the extending direction.

16. The display panel according to claim 1, wherein:
the display panel is a passive matrix organic light emitting diode display panel, and both sides of the first electrode or the second electrode in an extending direction thereof have a wave shape, wave crests of the two sides are oppositely disposed, and wave troughs of the two sides are oppositely disposed; and wave crests and wave troughs of adjacent first electrodes or adjacent second electrodes are staggered with one another.

17. The display panel according to claim 16, wherein:
the plurality of film layers further comprise a conductive line, and the conductive line is a single-layer line or a multilayer line, and the conductive line comprises at least one of a scan line, a data line, a power line, and a reset line; and when the conductive line is a single-layer line, the conductive line is disposed in the same layer as the first electrode layer; and when the conductive line is a multilayer line, at least one layer of the conductive line is disposed in the same layer as the first electrode layer, and the conductive line and the first electrode layer are made of the same material or different materials;

when a projection of the conductive line on the substrate partially overlaps a projection of the first electrode layer on the substrate, the first film layers or the second film layers also form a seventh path comprising the encapsulation layer, the second electrode layer, the light emitting layer, the first electrode layer, the conductive line and the substrate.

18. A display screen, comprising at least one display area, the at least one display area comprising a first display area, and a photosensitive device being disposed below the first display area; wherein
the display panel according to claim 1 is disposed in the first display area, and every display area of the at least one display area is used to display a dynamic or static image.

19. The display screen according to claim 18, wherein:
the at least one display area further comprises a second display area; the display panel provided in the first display area is a passive matrix organic light emitting diode display panel or an active matrix organic light emitting diode display panel, and the display panel provided in the second display area is an active matrix organic light emitting diode display panel.

\* \* \* \* \*